United States Patent
Vellianitis et al.

(10) Patent No.: US 11,869,975 B2
(45) Date of Patent: Jan. 9, 2024

(54) THIN-FILM TRANSISTORS AND METHOD FOR MANUFACTURING THE SAME

(71) Applicant: TAIWAN SEMICONDUCTOR MANUFACTURING COMPANY, LTD., Hsinchu (TW)

(72) Inventors: Georgios Vellianitis, Hsinchu (TW); Marcus Johannes Henricus Van Dal, Hsinchu (TW); Gerben Doornbos, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 39 days.

(21) Appl. No.: 17/234,015

(22) Filed: Apr. 19, 2021

(65) Prior Publication Data

US 2022/0336675 A1 Oct. 20, 2022

(51) Int. Cl.
*H01L 29/786* (2006.01)
*H01L 29/24* (2006.01)
*H01L 29/66* (2006.01)
*H01L 21/02* (2006.01)

(52) U.S. Cl.
CPC .. *H01L 29/78606* (2013.01); *H01L 21/02565* (2013.01); *H01L 29/24* (2013.01); *H01L 29/66969* (2013.01); *H01L 29/7869* (2013.01)

(58) Field of Classification Search
None
See application file for complete search history.

(56) References Cited

U.S. PATENT DOCUMENTS

| 9,991,394 | B2 | 6/2018 | Yamazaki | |
|---|---|---|---|---|
| 2011/0024840 | A1 | 2/2011 | Khater | |
| 2011/0084272 | A1 | 4/2011 | Miyanaga et al. | |
| 2011/0309353 | A1 | 12/2011 | Kaneko et al. | |
| 2012/0064664 | A1* | 3/2012 | Yamazaki | H01L 29/78696 438/104 |
| 2012/0112183 | A1* | 5/2012 | Endo | H01L 21/02664 257/E29.296 |
| 2014/0239289 | A1 | 8/2014 | Morooka et al. | |

(Continued)

FOREIGN PATENT DOCUMENTS

| JP | 2013-246248 A | 12/2013 |
|---|---|---|
| JP | 2014-170841 A | 9/2014 |

(Continued)

OTHER PUBLICATIONS

Yu et al., "Tungsten-Doped Indium Oxide Thin Film as an Effective High-Temperature Copper Diffusion Barrier", ECS Solid State Letters, 3 (6), N15-N17 (2014) (Year: 2014).*

(Continued)

*Primary Examiner* — Vincent Wall
(74) *Attorney, Agent, or Firm* — Birch, Stewart, Kolasch & Birch, LLP

(57) ABSTRACT

A transistor includes a gate electrode, a gate dielectric located over the gate electrode, a channel layer that includes an oxide semiconductor material and that is located over the gate dielectric, a buffer located to cover at least a portion of the channel layer, and source/drain contacts disposed on the buffer. The buffer includes a material that receives hydrogen. A method for manufacturing the transistor is also provided.

20 Claims, 23 Drawing Sheets

(56) References Cited

U.S. PATENT DOCUMENTS

| | | |
|---|---|---|
| 2014/0246666 A1 | 9/2014 | Morooka et al. |
| 2015/0249156 A1 | 9/2015 | Ohguro et al. |
| 2019/0172921 A1* | 6/2019 | Dewey .............. H01L 23/53204 |
| 2020/0098875 A1 | 3/2020 | Sung et al. |
| 2020/0388679 A1 | 12/2020 | Song et al. |
| 2021/0399139 A1 | 12/2021 | Li et al. |
| 2021/0408291 A1 | 12/2021 | Sharma et al. |
| 2021/0408296 A1 | 12/2021 | Zhong et al. |
| 2022/0157986 A1 | 5/2022 | Yamazaki et al. |
| 2023/0144044 A1 | 5/2023 | Iikubo et al. |

FOREIGN PATENT DOCUMENTS

| | | |
|---|---|---|
| JP | 2017-120896 A | 7/2017 |
| JP | WO2019/166906 A1 | 9/2019 |

OTHER PUBLICATIONS

U.S. Office Action dated Feb. 13, 2023 for U.S. Appl. No. 17/233,899.
Japanese Office Action for Japanese Application No. 2022-068005, dated May 23, 2023, with an English translation.
Taiwanese Search Report for Taiwanese Application No. 111102387, dated Apr. 19, 2023, with an English translation.
U.S. Office Action for U.S. Appl. No. 17/233,941, dated Jul. 28, 2023.

* cited by examiner

THIN-FILM TRANSISTORS AND METHOD FOR MANUFACTURING THE SAME

BACKGROUND

As the manufacturing technology of integrated circuit (IC) advances, fabricating transistors devices in a back end of line (BEOL) portion of the semiconductor fabrication process, instead of a front end of line (FEOL) portion of the semiconductor fabrication process, becomes an object for manufacturers. In attempting to achieve such object, a number of issues associated with the performance of the resulting transistors may be of interest.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
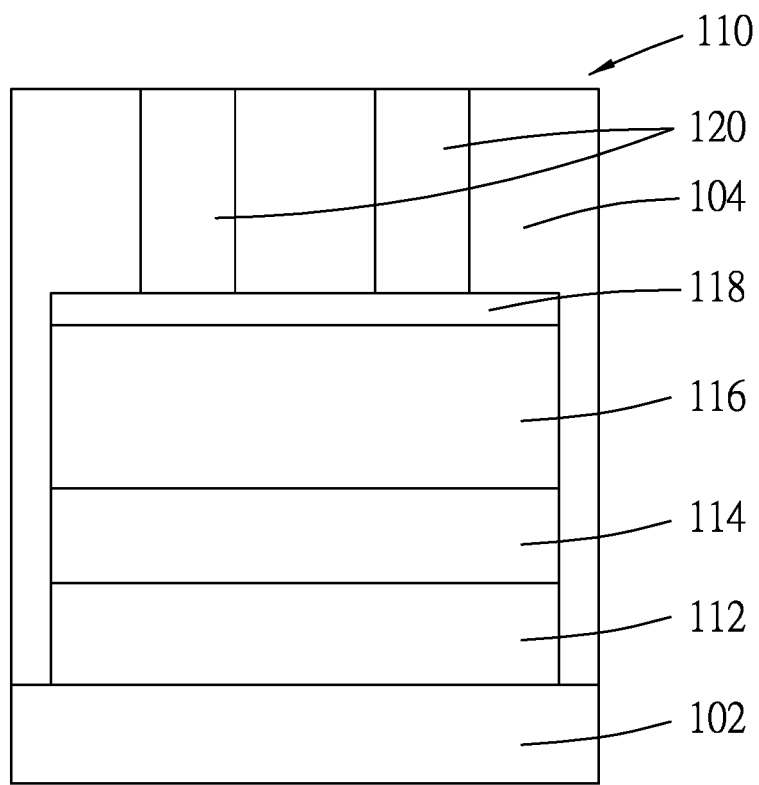
FIG. 1 illustrates a schematic cross-sectional view of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments where the first and second features are formed in direct contact, and may also include embodiments where additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and particularly to transistors including a channel layer with an oxide semiconductor, and methods for manufacturing the same. In some embodiments, the transistor may be a thin-film transistor (TFT), which is one type of metal-oxide-semiconductor field-effect transistor (MOSFET), and may be manufactured by depositing different layers on a substrate. The TFTs may be used in a number of commercial applications such as gate driver circuits, high-frequency display application, etc. Generally, a TFT is similar to a MOSFET in structure, and includes a gate terminal, a source terminal and a drain terminal. A semiconductor layer known as a channel layer is deposited to contact the source terminal and the drain terminal.

Various materials have been proposed to be used for fabricating the TFTs. It may be beneficial to use oxide semiconductors such as indium gallium zinc oxide (IGZO) to form some parts of the TFTs (e.g., the channel layer), since the fabrication of such devices may be integrated in a back end of line (BEOL) portion of the semiconductor fabrication process, instead of a front end of line (FEOL) portion of the semiconductor fabrication process.

A number of advantages may be presented by integrating the fabrication of TFTs in the BEOL. For example, the semiconductor fabrication process may be implemented at a relatively lower temperature, and therefore reduces the undesirable effect of damaging devices that are already fabricated. Additionally, it is noted that chip area in the FEOL is considered more valuable than that in the BEOL, and moving the fabrication of TFTs to the BEOL may result in a reduced chip area of approximately 5-10% for a given device.

In a typical TFT structure, two source/drain contacts may be disposed in contact with a channel layer. It is noted the channel layer of the TFTs fabricated in the BEOL may be sensitive to hydrogen gas and/or free hydrogen atoms, which may be generated or used in many processes, such as chemical vapor depositions (CVD). Upon annealing process, hydrogen (e.g., hydrogen gas and/or free hydrogen atoms) may be incorporated into the deposited material, and may diffuse from source/drain contacts through an interlayer dielectric (ILD) layer to reach and react with the channel layer. In the following, InGaZnO$_4$ is exemplified as a material of the channel layer, and 2H represents the hydrogen gas or two free hydrogen atoms. A reaction between the hydrogen gas (or free hydrogen atoms) and the channel layer may be represented as follow: $2H+InGaZnO_4 \rightarrow H_2O+InGaZnO_3-O_{vacancy}$. The $O_{vacancy}$ acts as a donor, and thus the channel layer is doped, which may change the electrical properties of the channel layer and may lead to strong negative threshold voltage shift. That is to say, an interface between the metal of the source/drain contacts and the oxide semiconductor material of the channel layer may result in increased doping due to the hydrogen gas and/or hydrogen atoms diffusing from, for example, the metal of the source/drain contacts into the oxide semiconductor material, a phenomenon known as hydrogen diffusion or H-diffusion. It is noted that in other steps of the fabrication process (e.g., a deposition of oxide material), hydrogen gas and/or hydrogen atoms may also be introduced into the channel layer, thereby doping the channel layer. With different dimensions of the channel layer, hydrogen diffusion may cause different degrees of threshold voltage shift, which might adversely affect a robustness of the channel layer.

FIG. 1 illustrates a schematic cross-sectional view of a semiconductor structure 100 in accordance with some embodiments. The semiconductor structure 100 may include a first dielectric layer 102, a second dielectric layer 104, and a transistor 110 formed between the first dielectric layer 102 and the second dielectric layer 104. In some embodiments, each of the first dielectric layer 102 and the second dielectric layer 104 may serve as an ILD layer in the BEOL.

In some embodiments, the transistor 110 may be a TFT that may be fabricated in the BEOL, but is not limited as such. In some embodiments, the transistor 110 includes a gate electrode 112, a gate dielectric 114 located over the gate electrode 112, a channel layer 116 located over the gate dielectric 114, a buffer located to cover at least a portion of the channel layer 116, and two source/drain contacts 120 disposed on the buffer.

In some embodiments (e.g., as shown in FIG. 1), the buffer includes a first buffer layer 118, the source/drain contacts 120 are located over the channel layer 116, and the gate electrode 112 and the gate dielectric 114 are located below the channel layer 116. This structure of the transistor 110 is typically referred to as a front-contacted, back-gate structure. It is noted that in relevant fields, the terms "front/back" and "top/bottom" may be used interchangeably. That is, the structure of the transistor 110 may be also referred to as a top-contacted, bottom-gate structure.

It is noted that, with the provision of the first buffer layer 118, which is disposed to separate the source/drain contacts 120 from the channel layer 116, the structure of the transistor 110 as described above may offer a number of advantages. For example, a contact resistance between the channel layer 116 and one of the two source/drain contacts 120 may be rendered lower. Additionally, the hydrogen gas and/or free hydrogen atoms moving away from the two source/drain contacts 120 may be received (absorbed) by the first buffer layer 118 instead of the channel layer 116, therefore may reduce the potential H-diffusion phenomenon and associated adverse effects. Therefore, in some embodiments, the channel layer 116 and the first buffer layer 118 may be formed using different materials, or alternatively formed to have different structural properties. In some embodiments, one of the channel layer 116 and the first buffer layer 118 may be formed to have a crystalline structure, and the other one of the channel layer 116 and the first buffer layer 118 may be formed to have an amorphous structure.

Figure 2:
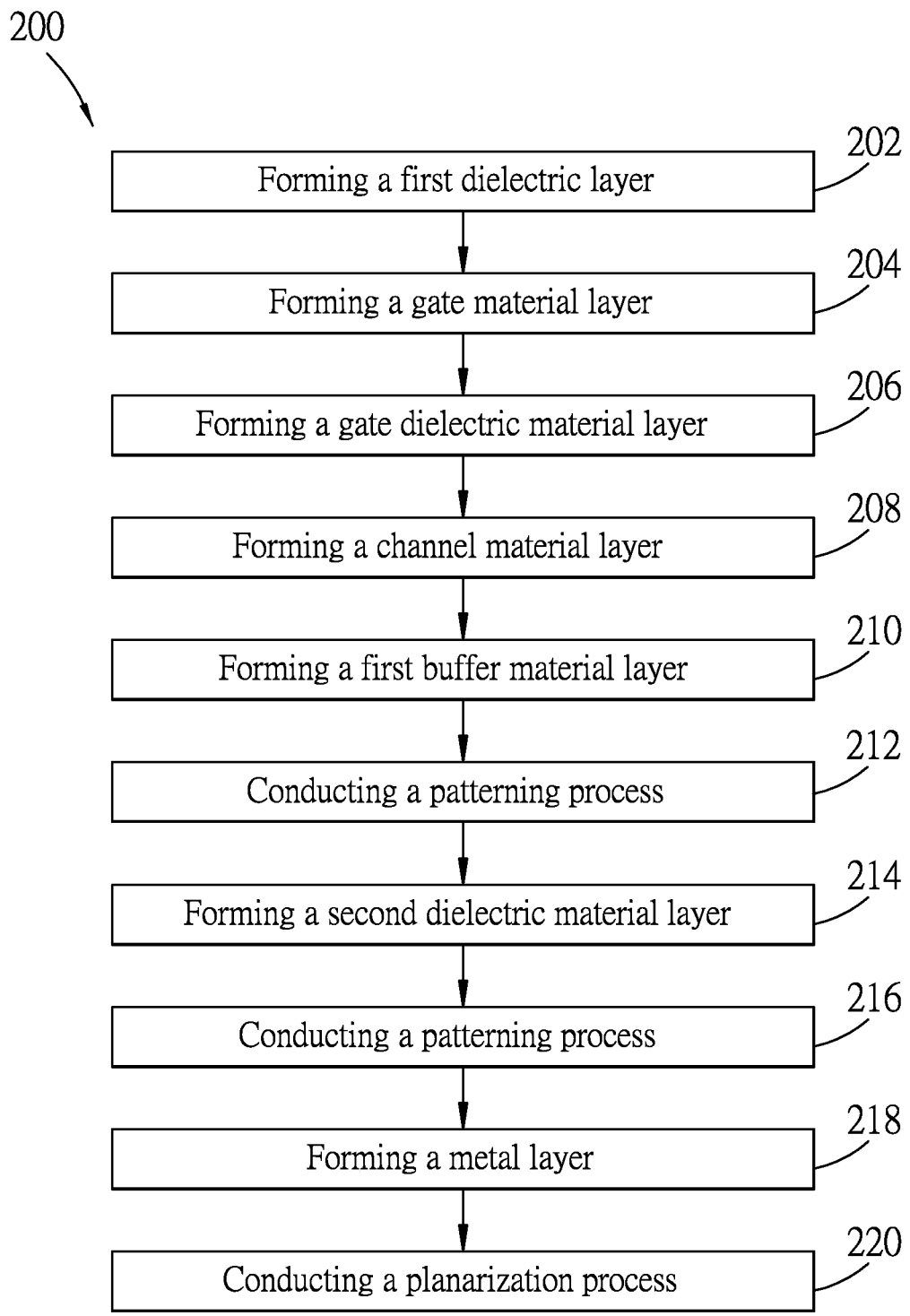
FIG. 2 is a flow diagram illustrating a method for manufacturing a semiconductor structure of FIG. 1 in accordance with some embodiments.

FIG. 2 is a flow diagram illustrating a method 200 for manufacturing a semiconductor structure including a transistor, for example, the semiconductor structure 100 as shown FIG. 1, in accordance with some embodiments. FIGS. 3 to 13 illustrate schematic views of the intermediate stages of the method 200.

Figure 3:
FIGS. 3 to 13 illustrate schematic views of intermediate stages of a method for manufacturing the semiconductor structure as depicted in FIG. 2 in accordance with some embodiments.

Referring to FIGS. 2 and 3, the method begins at step 202, where the first dielectric layer 102 is formed. In some embodiments, the first dielectric layer 102 may serve as an ILD layer, and may include materials such as, but not limited to, silica (SiO$_2$), hafnium silicate (HfSiO$_4$), zirconium silicate (ZrSiO$_4$), or combinations thereof. In alternative embodiments, the first dielectric layer 102 may include, but not limited to, polyimide, epoxy resin, acrylic resin, phenol resin, benzocyclobutene (BCB), polybenzooxazole (PBO), other suitable polymer-based dielectric materials, or combinations thereof. Other suitable dielectric materials for forming the first dielectric layer 102 are within the contemplated scope of the present disclosure.

Step 202 may be implemented using, for example, but not limited to, CVD, physical vapor deposition (PVD), sputtering, combinations thereof, or other suitable techniques. In some embodiments, the first dielectric layer 102 may be a single material layer. In alternative embodiments, the first dielectric layer 102 may be constituted by multiple films made of different materials. In some embodiments, step 202 may be implemented in BEOL of the fabrication process.

Figure 4:
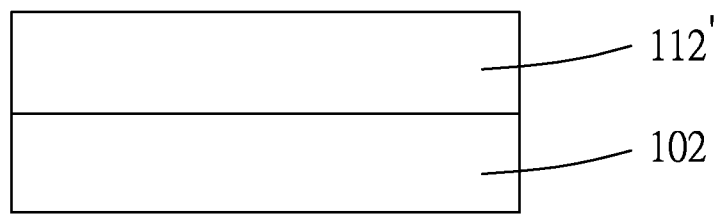

Referring to FIGS. 2 and 4, the method 200 proceeds to step 204, where a gate material layer 112' is formed on the first dielectric layer 102. The gate material layer 112' may include a metallic material, a metal compound, polycrystalline silicon, or doped silicon. Other materials suitable for forming the gate material layer 112' are within the scope of the present disclosure. The metallic material may include, for example, but not limited to, silver (Ag), aluminum (Al), copper, tungsten, nickel (Ni), other suitable materials, alloys thereof, or combinations thereof. The metal compound may include, for example, but not limited to, titanium nitride (TiN), tantalum nitride (TaN), metal silicide, other suitable materials, or combinations thereof.

In some embodiments, the gate material layer 112' may be deposited by, for example, but not limited to, PVD, CVD, sputtering, plating, combinations thereof, or other suitable techniques.

Figure 5:

Referring to FIGS. 2 and 5, the method 200 proceeds to step 206, where a gate dielectric material layer 114' is formed on the gate material layer 112'. The gate dielectric material layer 114' may include a high-k dielectric material such as, but not limited to, silicon oxide (SiO$_2$), silicon nitride (Si$_3$N$_4$), silicon oxynitride (SiO$_x$N$_y$), hafnium oxide (HfO$_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium silicate, zirconium aluminate, zirconium oxide, titanium oxide, aluminum oxide ($Al_2O_3$), hafnium dioxide-alumina ($HfO_2$—$Al_2O_3$) alloy, or combinations thereof. Other suitable dielectric materials for forming the gate dielectric material layer 114' are within the contemplated scope of the present disclosure.

In some embodiment, the gate dielectric material layer 114' may be formed by, for example, but not limited to, sputtering, CVD, PVD, atomic layer deposition (ALD), plasma-enhanced ALD, molecular beam epitaxy (MBE), combinations thereof, or other suitable techniques. In some embodiments, the gate dielectric material layer 114' may include one or more layers, each being made using one or more of the dielectric materials mentioned above.

Figure 6:
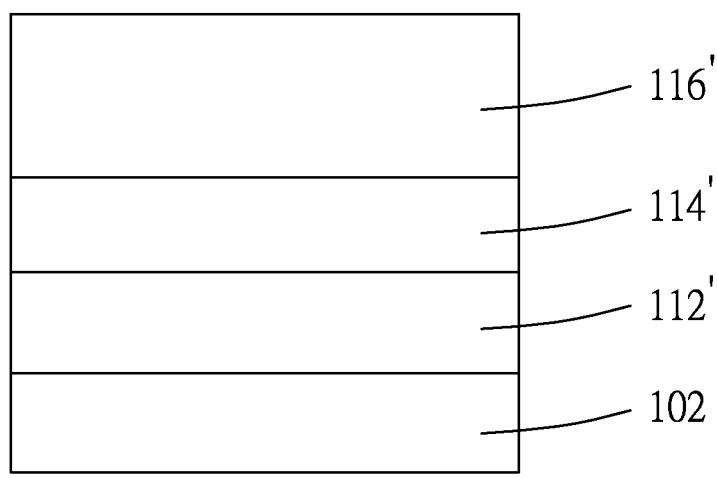

Referring to FIGS. 2 and 6, the method 200 proceeds to step 208, where a channel material layer 116' is formed on the gate dielectric material layer 114'. The channel material layer 116' may include an oxide semiconductor material such as, but not limited to, indium gallium zinc oxide (IGZO), indium zinc oxide (IZO), zinc oxide (ZnO), indium tin oxide (InSnO), tungsten-doped indium oxide (InWO), gallium oxide ($GaO_x$), indium oxide ($I_nO_x$), and the like. In alternative embodiments, the channel material layer 116' may further include, for example, but not limited to, amorphous silicon, crystalline silicon, or the like. Other suitable materials for forming the channel material layer 116' are within the contemplated scope of the present disclosure.

Step 208 may be implemented using CVD, PVD, ALD, plasma-enhanced CVD (PECVD), epitaxial growth, or other suitable techniques.

Figure 7:
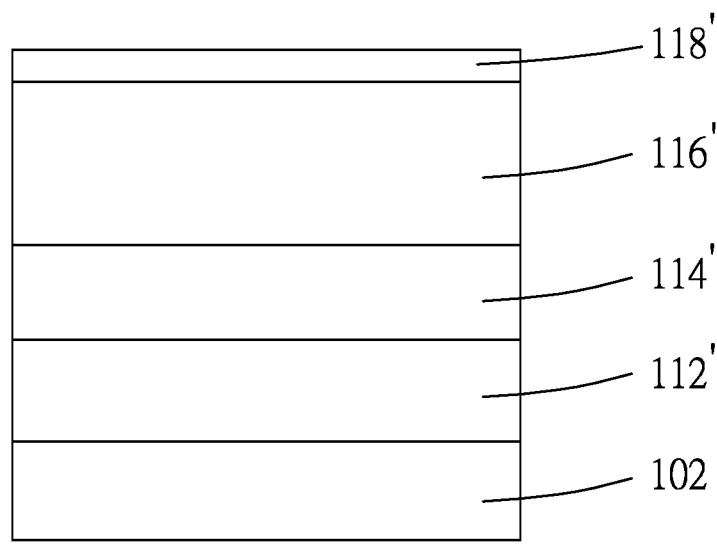

Referring to FIGS. 2 and 7, the method 200 proceeds to step 210, where a first buffer material layer 118' is formed on the channel material layer 116'. The first buffer material layer 118' may include indium gallium zinc oxide (IGZO), gallium oxide ($GaO_x$, e.g., $Ga_2O_3$), crystalline InZnGaOx (c-IGZO), a semiconductor material including indium, gallium, zinc, silicon, and oxide (IGSZO, InGaSiZnOx), indium tin oxide (ITO), $Zr_xNi_y$, indium oxide ($InO_x$, e.g., $In_2O_3$), indium zinc oxide (IZO), zinc oxide (ZnO), tungsten-doped indium oxide (InWO), or combinations thereof. To be specific, $Zr_xNi_y$ is a metal compound including Zr (zirconium) and Ni (nickel). Other suitable materials for forming the first buffer material layer 118' are within the contemplated scope of the present disclosure. In some embodiments, the first buffer material layer 118' may be formed using ALD, PVD, CVD, plating, or other suitable deposition techniques. A thickness of the first buffer material layer 118' may be in a range of about 0.1 to about 10 nanometers, although the first buffer material layer 118' may have a wider or narrower thickness based on the product to be fabricated.

Figure 8:
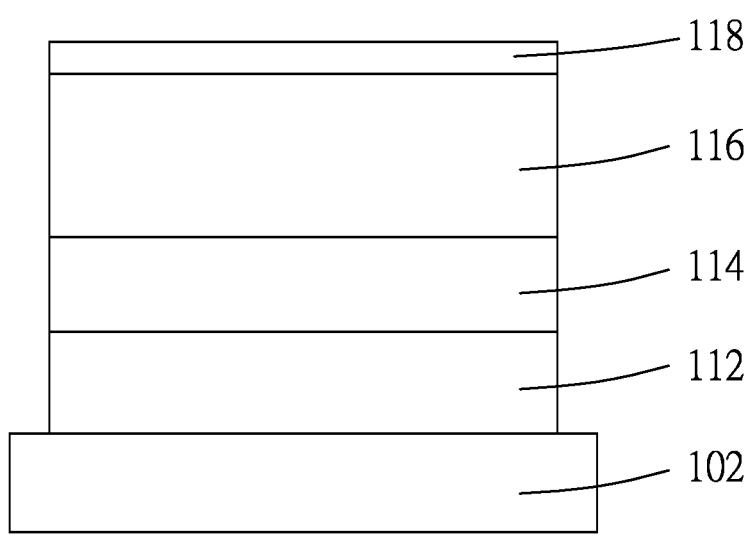

Referring to FIGS. 2 and 8, the method 200 proceeds to step 212, where a patterning process is conducted so as to form a pattern for the gate material layer 112', the gate dielectric material layer 114', the channel material layer 116' and the first buffer material layer 118'. As a result, a patterned gate material layer, a patterned gate dielectric material layer, a patterned channel material layer and a patterned first buffer material layer are formed to serve as the gate electrode 112, the gate dielectric layer 114, the channel layer 116, and the first buffer layer 118 of the transistor 110 shown in FIG. 1, respectively. It is noted that in some embodiments, the gate electrode 112 and the gate dielectric 114 may cooperatively form a gate stack, and the gate dielectric 114 is disposed between the gate electrode 112 and the channel layer 116.

In some embodiments, the patterning process in step 212 includes a photolithography process, an etching process, and a stripping process. In some embodiments, the photolithography process may include, for example, but not limited to, coating a photoresist layer on the first buffer material layer 118', then soft-baking, exposing the photoresist through a photomask (not shown in the drawings), post-exposure baking, developing the photoresist, followed by hard-baking, so as to form a patterned photoresist (not shown in the drawings).

Afterward, the etching process may be implemented by etching the gate material layer 112', the gate dielectric material layer 114', the channel material layer 116' and the first buffer material layer 118' through the patterned photoresist using, for example, but not limited to, a dry etching process, a wet etching process, other suitable processes, or combinations thereof.

After the etching process is completed, the stripping process is conducted for stripping the patterned photoresist. Based on the materials of the patterned photoresist, a number of suitable chemical solutions may be used to strip the patterned photoresist.

Figure 9:
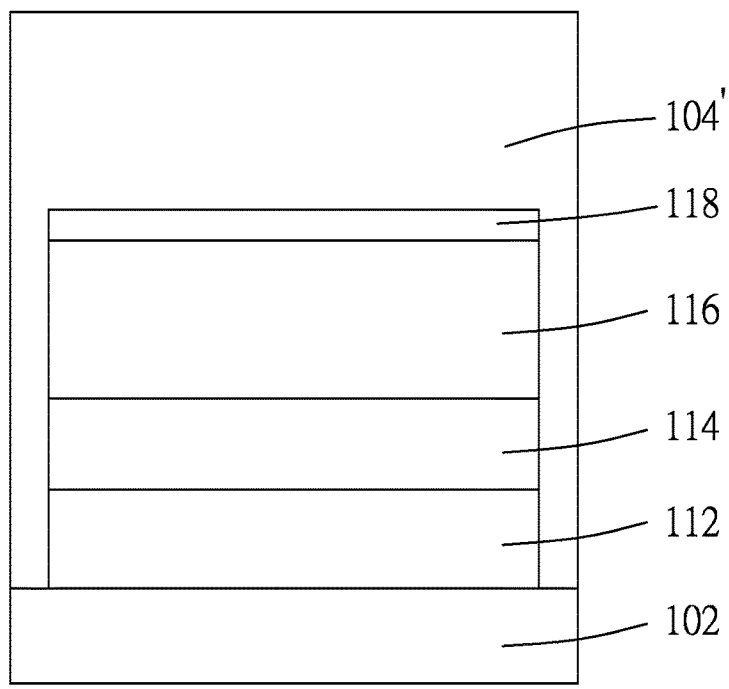

Referring to FIGS. 2 and 9, the method 200 proceeds to step 214, where a second dielectric material layer 104' is formed on the first dielectric layer 102, the gate electrode 112, the gate dielectric 114, the channel layer 116, and the first buffer layer 118. The materials and techniques used for forming the second dielectric material layer 104' are similar to those used for forming the first dielectric layer 102 as described in step 202, and the details thereof are omitted herein for the sake of brevity. In some embodiments, the second dielectric material layer 104' may be a single material layer. In alternative embodiments, the second dielectric material layer 104' may be constituted by multiple films made of different materials which are suitable for forming the first dielectric layer 102. It is noted that a chemical-mechanical planarization (CMP) process or other suitable process is performed to planarize a top surface of the second dielectric material layer 104'.

Figure 10:
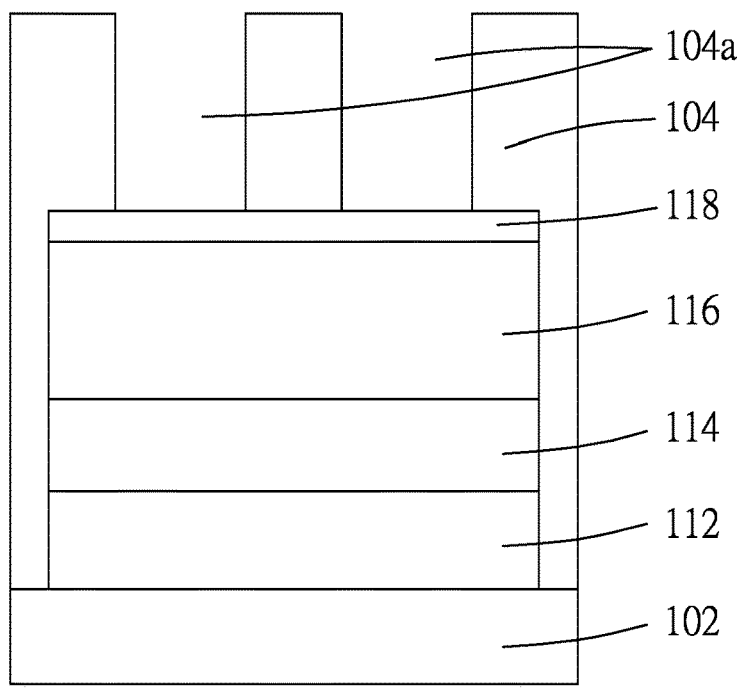

Referring to FIGS. 2 and 10, the method 200 proceeds to step 216, where a patterning process is conducted to pattern the second dielectric material layer 104'. The patterning process in this step may be implemented using a technique as described in step 212 such that portions of the second dielectric material layer 104' are removed in a top-down direction. As a result, two trenches 104a are formed in the second dielectric material layer 104', thereby obtaining the second dielectric layer 104 as shown in FIG. 1.

Figure 11:
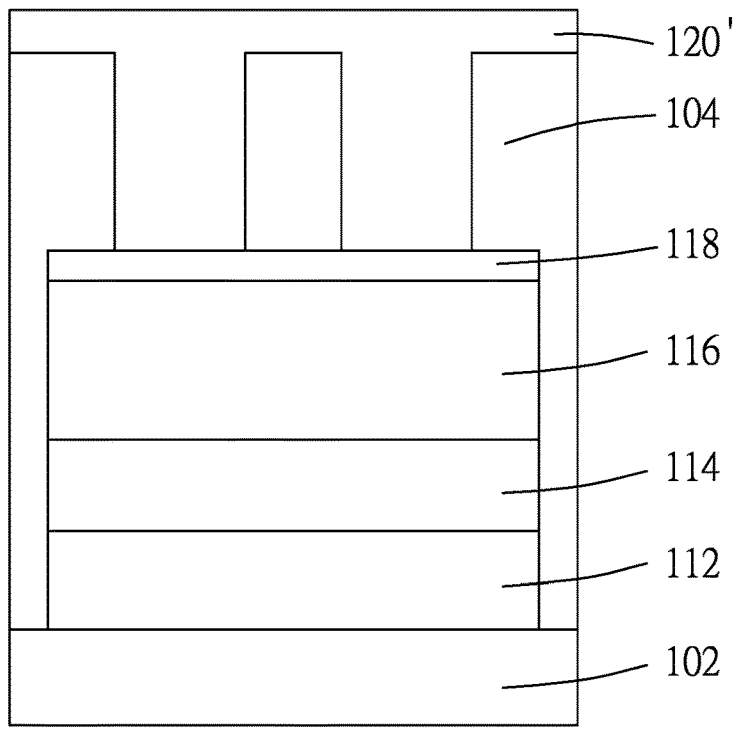

Referring to FIGS. 2 and 11, the method 200 proceeds to step 218, where a metal layer 120' is formed on the second dielectric layer 104 to fill the trenches 104a shown in FIG. 10. The metal layer 120' may include metals such as tungsten (W), ruthenium (Ru), copper (Cu), or combinations thereof. Other suitable materials for forming the metal layer 120' are within the contemplated scope of the present disclosure. The metal layer 120' may be formed using PVD, CVD, ALD, plating, or other suitable deposition techniques.

Figure 12:
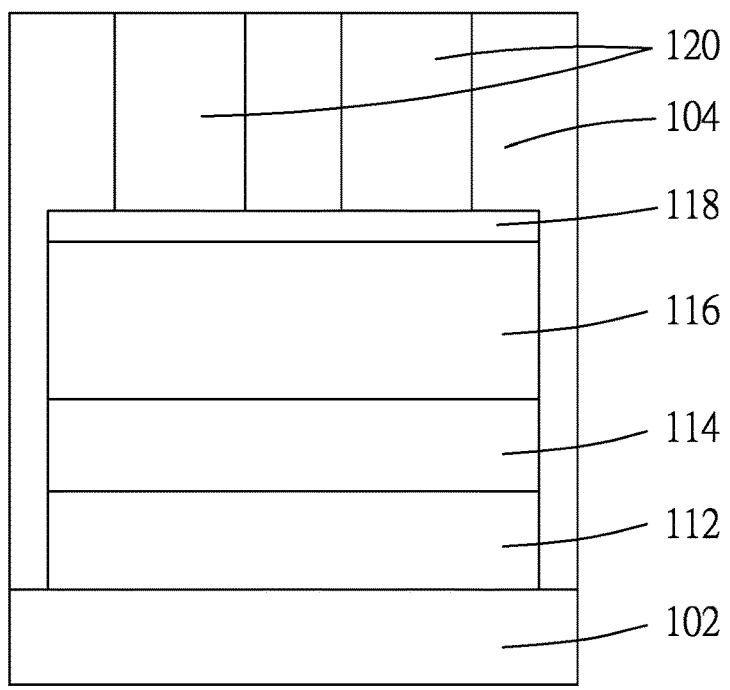

Referring to FIGS. 2 and 12, the method 200 proceeds to step 220, where a planarization process such as a CMP process, or other suitable technique is conducted to remove excesses of the metal layer 120'. In some embodiments, the CMP process may be performed to the point that the second dielectric layer 104 is exposed. At this stage, the metal layer 120' remaining in the trenches 104a shown in FIG. 10 may serve as the two source/drain contacts 120 of the transistor 110 shown in FIG. 1. It is noted that the formation of the source/drain contacts 120 creates a current-carrying channel therebetween. It is noted that since the transistor 110 may be fabricated in the BEOL, the source/drain contacts 120 may be configured to be connected to one of a number of metal contact lines (M0, M1, . . . , Mx) that interconnects different layers in a part of the BEOL stack.

Thus, the method 200 for manufacturing the semiconductor structure 100 shown in FIG. 1 is completed. Other suitable methods may be also used for manufacturing the semiconductor structure 100 shown in FIG. 1.

Figure 13:
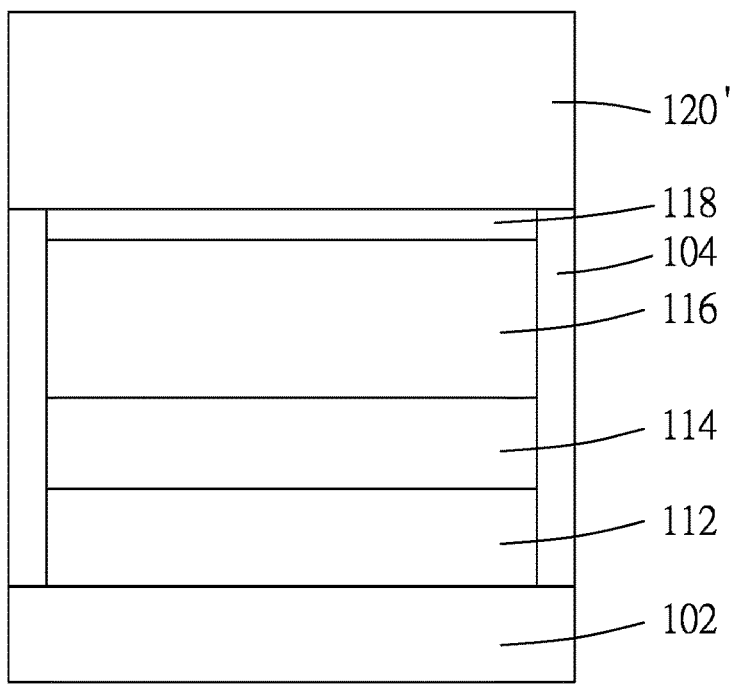

Referring to FIGS. 2 and 13, it is noted that in alternative embodiments, the steps of the method for manufacturing of the semiconductor structure 100 may be slightly altered. For example, after forming a second dielectric material layer 104' shown in FIG. 9 (step 214), a planarization process may be first conducted so as to expose the first buffer layer 118, followed by a step of forming the metal layer 120' on the second dielectric material layer 104' and the first buffer layer 118 (see FIG. 13). Then, a patterning process may be conducted so as to form the two source/drain contacts 120, followed by forming another layer of dielectric material and conducting another planarization process. In yet alternative embodiments, additional features may be added to the semiconductor structure 100 shown in FIG. 1, and some features of the semiconductor structure 100 shown in FIG. 1 may be modified, replaced, or eliminated without departing from the spirit and scope of the present disclosure.

Figure 14:
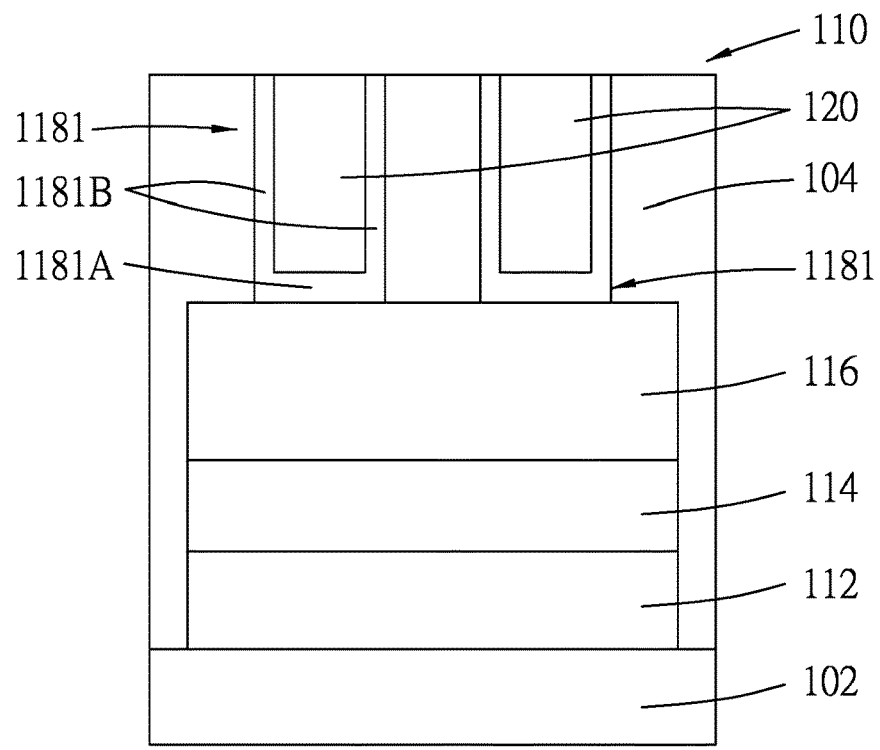
FIG. 14 illustrates a schematic cross-sectional view of a semiconductor structure in accordance with some embodiments.

FIG. 14 illustrates a schematic cross-sectional view of a semiconductor structure 100 in accordance with some embodiments. It is noted that in the semiconductor structure 100 shown in FIG. 1, the buffer of the transistor 110 includes a first buffer layer 118. In the semiconductor structure 100 shown in FIG. 14, the buffer of the transistor 110 includes two U-shaped buffer regions 1181 that are formed to surround the two source/drain contacts 120, respectively.

Each of the buffer regions 1181 includes an interconnecting section 1181A that is in contact with the channel layer 116 and a corresponding one of the source/drain contacts 120, and two extending sections 1181B each extending from two opposite ends of the interconnecting section 1181A to be in contact with one of two opposite surfaces of the corresponding one of the source/drain contacts 120. It is noted that in order to ensure the transistor 110 functions normally, the buffer regions 1181 are disposed to be spaced apart from each other.

Figure 15:
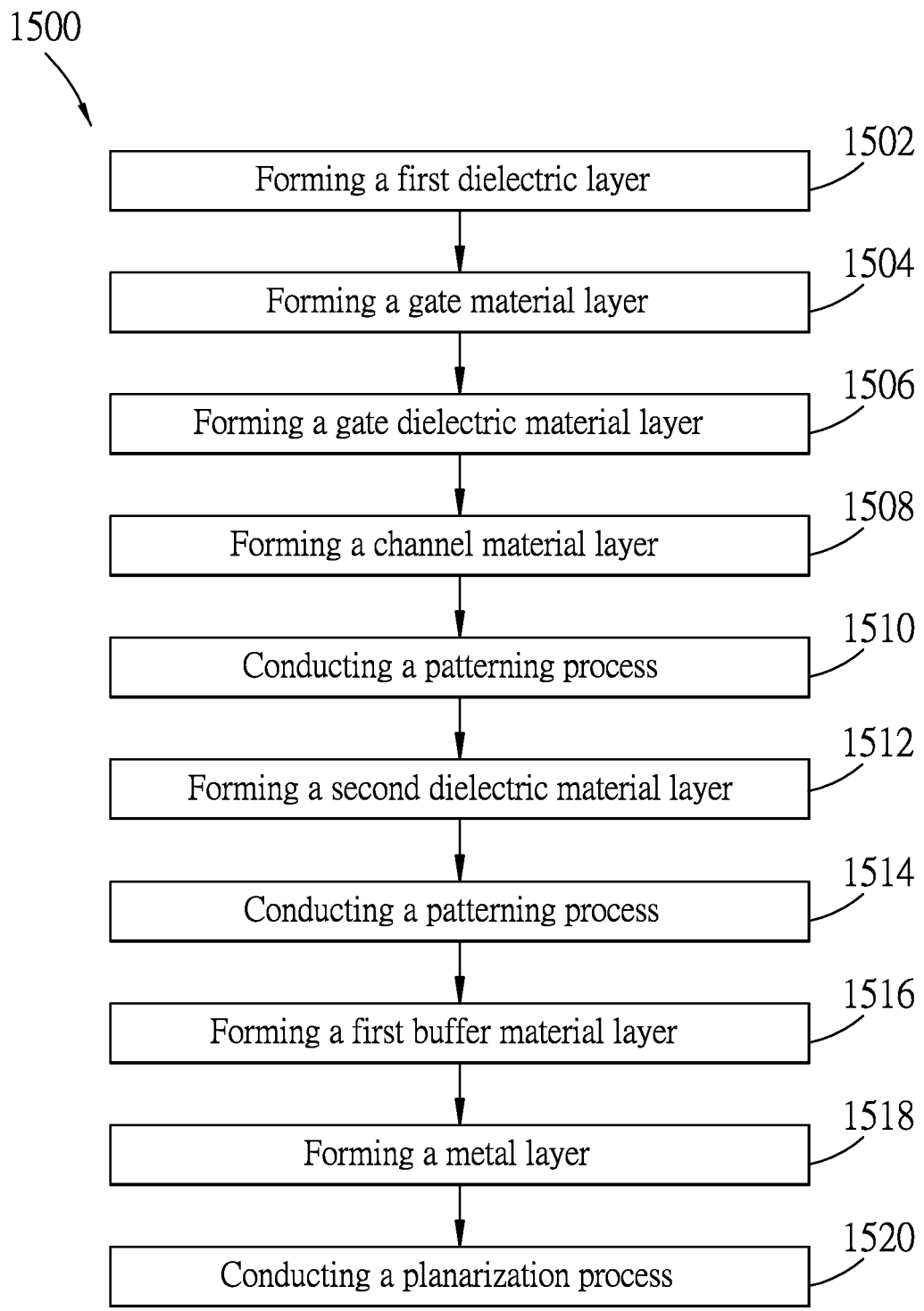
FIG. 15 is a flow diagram illustrating a method for manufacturing a semiconductor structure of FIG. 14 in accordance with some embodiments.

FIG. 15 is a flow diagram illustrating a method 1500 for manufacturing a semiconductor structure with a transistor, for example, the semiconductor structure 100 as shown in FIG. 14, in accordance with some embodiments. FIGS. 16 to 20 illustrate schematic views of the intermediate stages of the method 1500.

It is noted that the semiconductor structure 100 as shown in FIG. 14 may be fabricated using a method that is generally similar to the method 200. That is to say, the operations of steps 1502, 1504, 1506 and 1508 may be performed in a manner similar to steps 202, 204, 206 and 208, respectively so as to fabricate the structure as shown in FIG. 6. As such, the details regarding steps 1502, 1504, 1506 and 1508 are omitted herein for the sake of brevity. Afterward, in step 1510, a patterning process is conducted so as to form a pattern for the gate material layer 112', the gate dielectric material layer 114', and the channel material layer 116'. As a result, a patterned gate material layer, a patterned gate dielectric material layer and a patterned channel material layer are formed to serve as the gate electrode 112, the gate dielectric 114 and the channel layer 116 of the transistor 110 shown in FIG. 14, respectively.

Figure 16:
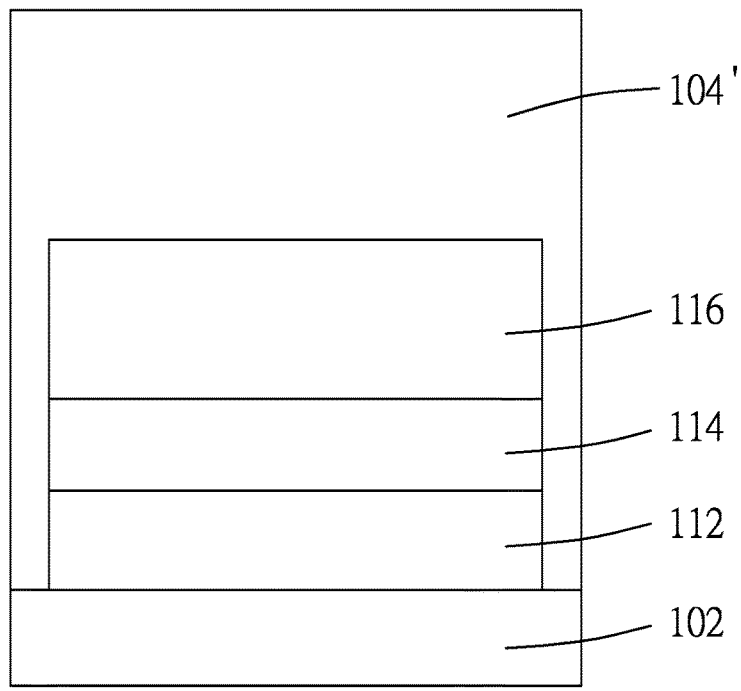
FIGS. 16 to 20 illustrate schematic views of intermediate stages of a method for manufacturing the semiconductor structure as depicted in FIG. 15 in accordance with some embodiments.

Afterward, referring to FIGS. 15 and 16, the method 1500 proceeds to step 1512, where a second dielectric material layer 104' is formed on the first dielectric layer 102, the gate electrode 112, the gate dielectric 114, and the channel layer 116. The materials and techniques used for forming the second dielectric material layer 104' are similar to those used for forming the first dielectric layer 102 as described in step 202, and the details thereof are omitted herein for the sake of brevity. In some embodiments, the second dielectric material layer 104' may be a single material layer. In alternative embodiments, the second dielectric material layer 104' may be constituted by multiple films made of different materials which are suitable for forming the first dielectric layer 102. It is noted that a CMP process or other suitable process may be performed to planarize a top surface of the second dielectric material layer 104'.

Figure 17:
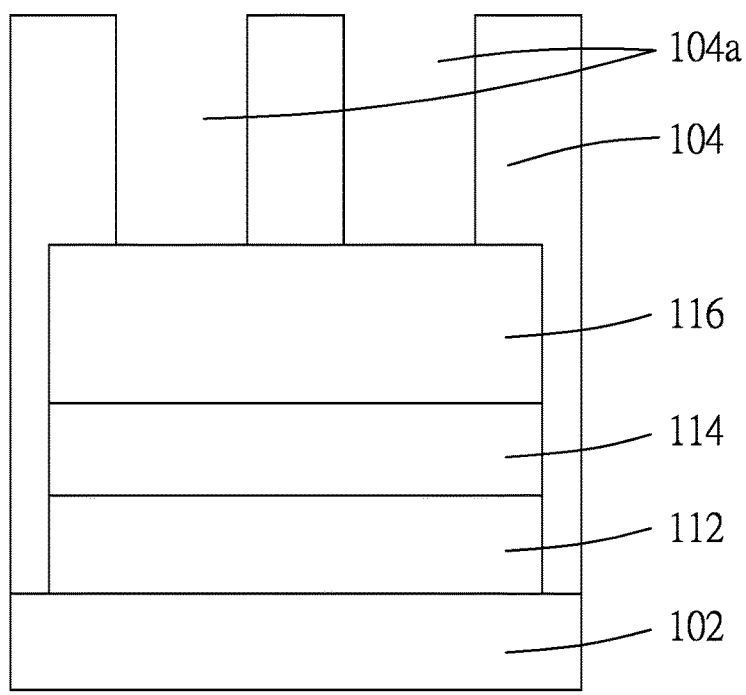

Referring to FIGS. 15 and 17, the method 1500 proceeds to step 1514, where a patterning process is conducted to pattern the second dielectric material layer 104'. The patterning process in this step may be implemented using a technique as described in step 212 to remove portions of the second dielectric material layer 104' in a top-down direction. As a result, two trenches 104a are formed in the second dielectric material layer 104' to expose the channel layer 116, thereby obtaining the second dielectric layer 104 as shown in FIG. 14.

Figure 18:
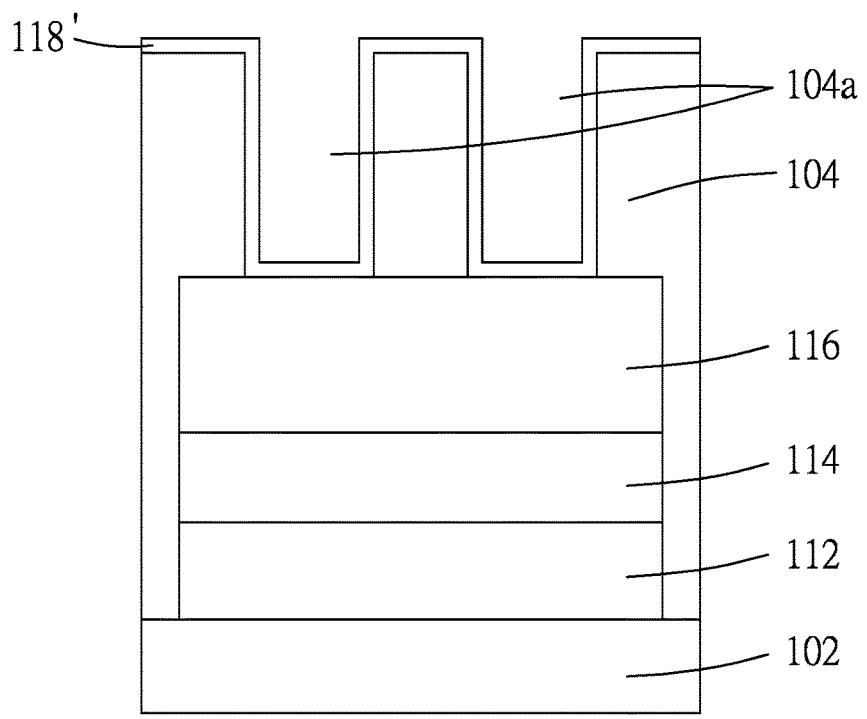

Referring to FIGS. 15 and 18, the method 1500 proceeds to step 1516, where a first buffer material layer 118' is conformally formed on the second dielectric layer 104 along inner surfaces of the trenches 104a. The materials and techniques used for forming the first buffer material layer 118' may be similar to those used for forming the first buffer material layer 118' as described in step 210, and the details thereof are omitted herein for the sake of brevity.

Figure 19:
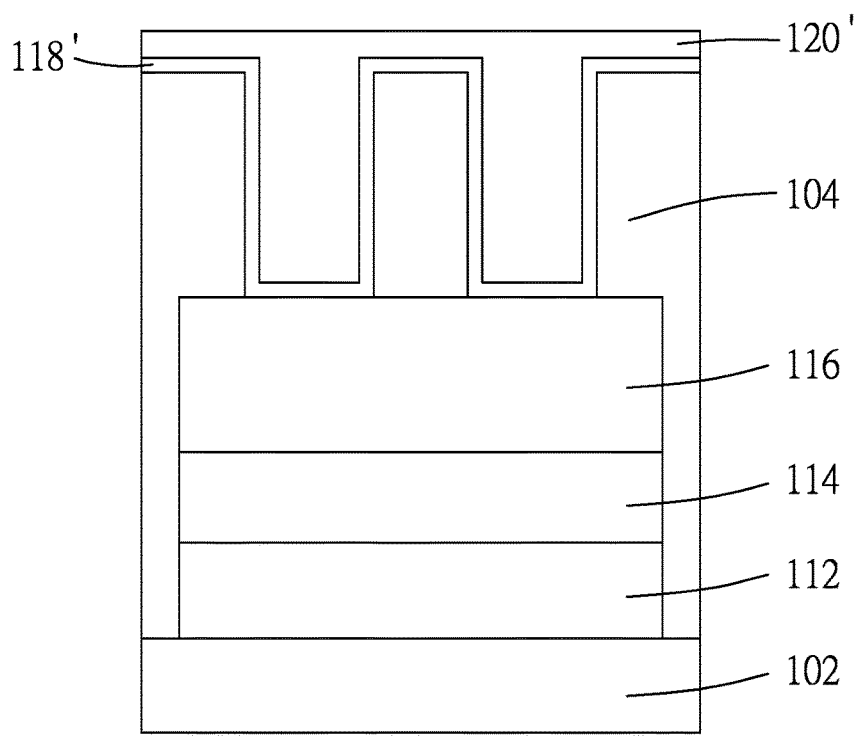

Referring to FIGS. 15 and 19, the method 1500 proceeds to step 1518, where a metal layer 120' is formed on the second dielectric layer 104 to fill the trenches 104a along surfaces of the first buffer material layer 118' as shown in FIG. 18. The materials and techniques used for forming the metal layer 120' may be similar to those used for forming the metal layer 120' as described in step 218, and the details thereof are omitted herein for the sake of brevity.

Figure 20:
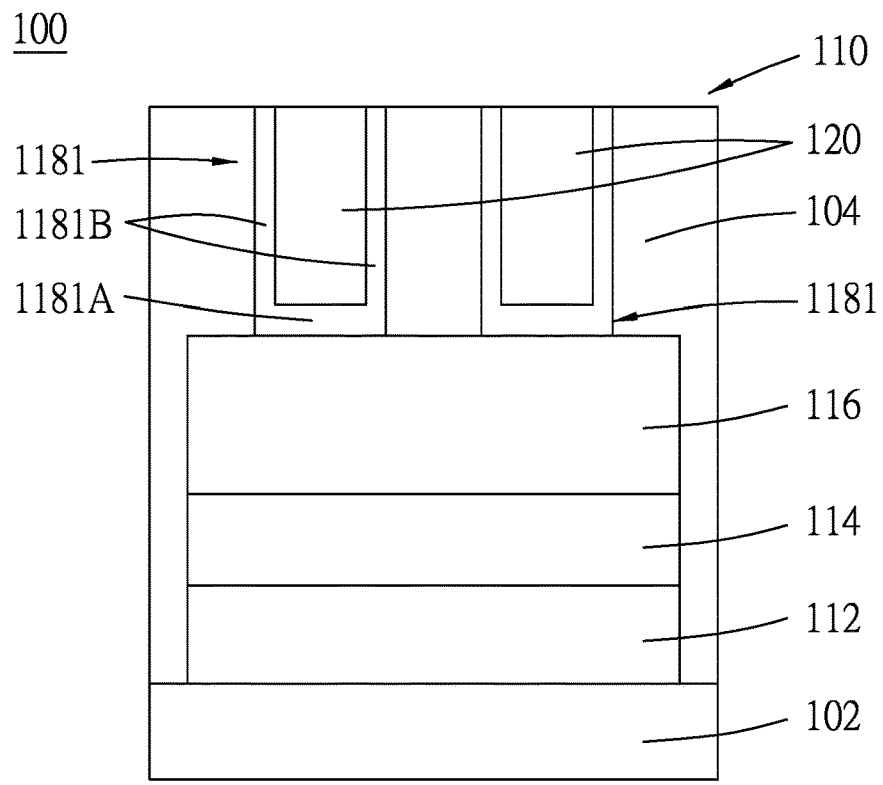

Referring to FIGS. 15 and 20, the method 1500 proceeds to step 1520, where a planarization process such as a CMP process, or other suitable technique is conducted to remove excesses of the first buffer material layer 118' and the metal layer 120'. In some embodiments, the CMP process may be performed to the point that the second dielectric layer 104 is exposed. At this stage, the first buffer material layer 118' remaining in the trenches 104a shown in FIG. 19 may serve as the buffer regions 1181 of the transistor 110 shown in FIG. 14, and the metal layer 120' remaining in the trenches 104a shown in FIG. 19 may serve as the two source/drain contacts 120 of the transistor 110 shown in FIG. 14. In this manner, the source/drain contacts 120 are formed in the trenches 104a so as to permit each of the source/drain contacts 120 to be surrounded by a respective one of the buffer regions 1181.

Thus, the method 1500 for manufacturing the semiconductor structure 100 shown in FIG. 14 is completed. In alternative embodiments, other suitable methods may also be applied for forming the semiconductor structure 100 shown in FIG. 14. In yet alternative embodiments, additional features may be added to the semiconductor structure 100 shown in FIG. 14, and some features of the semiconductor structure 100 shown in FIG. 14 may be modified, replaced, or eliminated without departing from the spirit and scope of the present disclosure.

Figure 21:
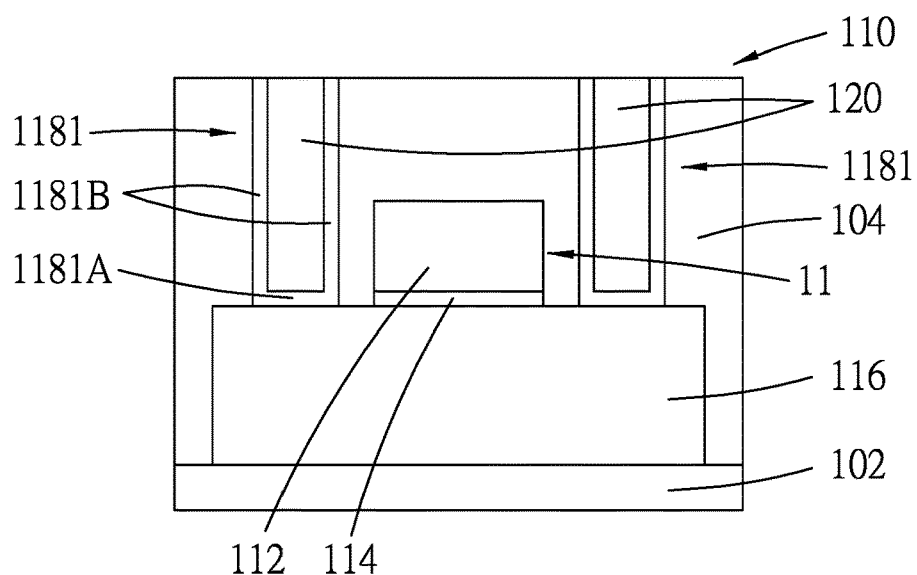
FIG. 21 illustrates a schematic cross-sectional view of a semiconductor structure in accordance with some embodiments.

FIG. 21 illustrates a schematic cross-sectional view of a semiconductor structure 100 in accordance with some embodiments. It is noted that in the semiconductor structure 100 shown in FIG. 1, the transistor 110 has a front-contacted, back-gate structure. In the semiconductor structure 100 as shown in FIG. 21, the gate dielectric 114 is located over the channel layer 116 and between the source/drain contacts 120, and the gate electrode 112 is located over the gate dielectric 114 (i.e., the source/drain contacts 120 are disposed at opposite sides of the gate dielectric 114 and the gate electrode 112). That is to say, the transistor 110 shown in FIG. 21 has a front-contacted, front-gate structure. Additionally, in the semiconductor structure 100 as shown in FIG. 21, the buffer of the transistor 110 includes two U-shaped buffer regions 1181 that are formed to surround the two source/drain contacts 120, respectively, in a manner similar to that of the transistor 110 as shown in FIG. 14.

Figure 22:
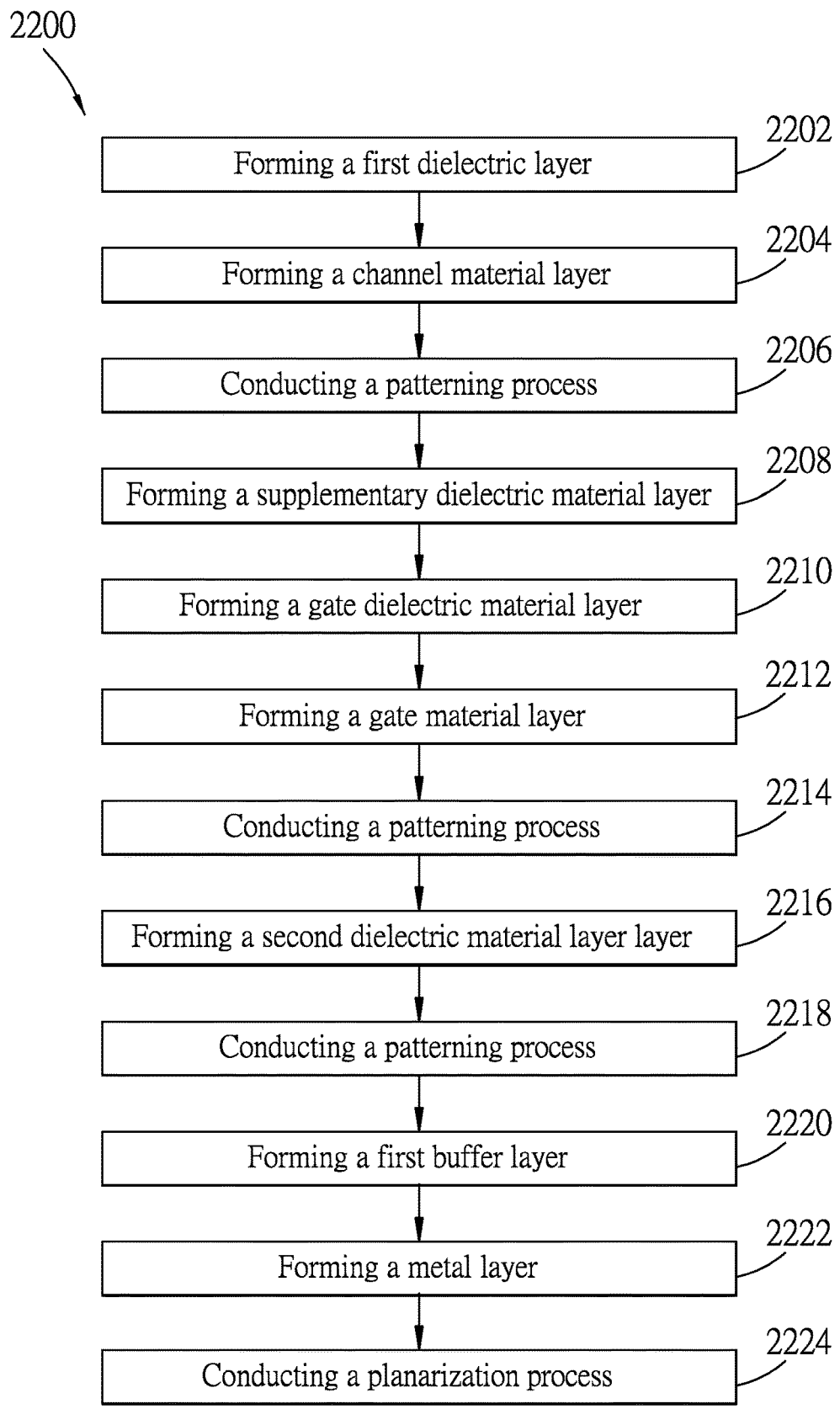
FIG. 22 is a flow diagram illustrating a method for manufacturing a semiconductor structure of FIG. 21 in accordance with some embodiments.

FIG. 22 is a flow diagram illustrating a method 2200 for manufacturing a semiconductor structure with a transistor, for example, the semiconductor structure 100 as shown in FIG. 21, in accordance with some embodiments. FIGS. 23 to 34 illustrate schematic views of the intermediate stages of the method 2200.

Figure 23:
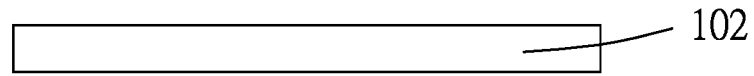
FIGS. 23 to 34 illustrate schematic views of intermediate stages of a method for manufacturing the semiconductor structure as depicted in FIG. 22 in accordance with some embodiments.

Referring to FIGS. 22 and 23, the method 2200 commences at step 2202, where the first dielectric layer 102 is formed. In some embodiments, the first dielectric layer 102 may serve as an ILD layer. The materials and techniques used for forming the first dielectric layer 102 may be similar to those used for forming the first dielectric layer 102 as described in step 202, and the details thereof are omitted herein for the sake of brevity.

Figure 24:

Referring to FIGS. 22 and 24, the method 2200 commences at step 2204, where a channel material layer 116' is formed on the first dielectric layer 102. The materials and techniques used for forming the channel material layer 116' may be similar to those used for forming the channel material layer 116' as described in step 208, and the details thereof are omitted herein for the sake of brevity.

Figure 25:
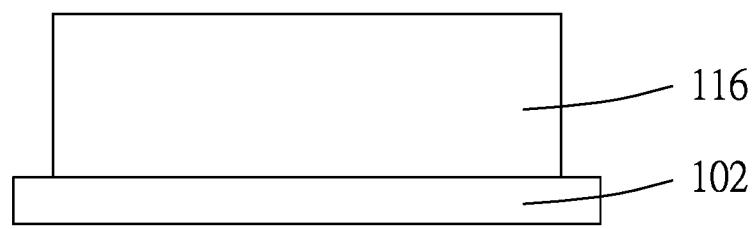

Referring to FIGS. 22 and 25, the method 2200 proceeds to step 2206, where a patterning process is conducted so as to form a pattern for the channel material layer 116'. As a result, a patterned channel material layer is formed to serve as the channel layer 116 of the transistor 110 shown in FIG. 21. The patterning process may be similar to that described in step 212, and the details thereof are omitted herein for the sake of brevity.

Figure 26A:
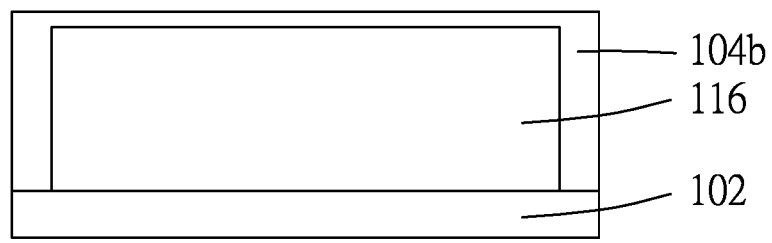
Figure 26B:
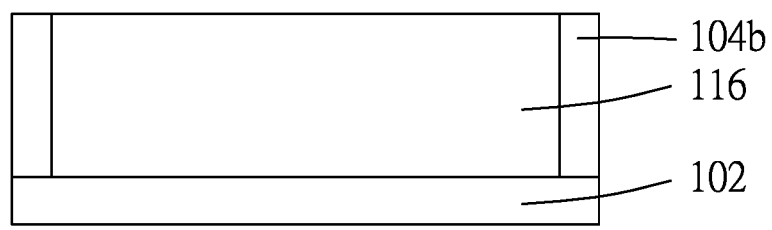

Referring to FIGS. 22 and 26A, the method 2200 proceeds to step 2208, where a supplementary dielectric material layer 104b is formed on the first dielectric layer 102 and the channel layer 116. The materials and techniques used for forming the supplementary dielectric material layer 104b are similar to those used for forming the first dielectric layer 102 as described in step 202, and the details thereof are omitted herein for the sake of brevity. Afterward, referring to FIG. 26B, a CMP process or other suitable process is performed to planarize a top surface of the supplementary dielectric material layer 104b.

Figure 27:
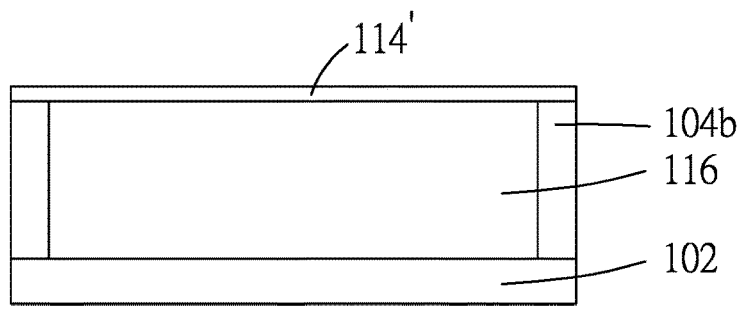

Referring to FIGS. 22 and 27, the method 2200 proceeds to step 2210, where a gate dielectric material layer 114' is formed on the supplementary dielectric material layer 104b. The materials and techniques used for forming the gate dielectric material layer 114' may be similar to those used for forming the gate dielectric material layer 114' as described in step 206, and the details thereof are omitted herein for the sake of brevity.

Figure 28:
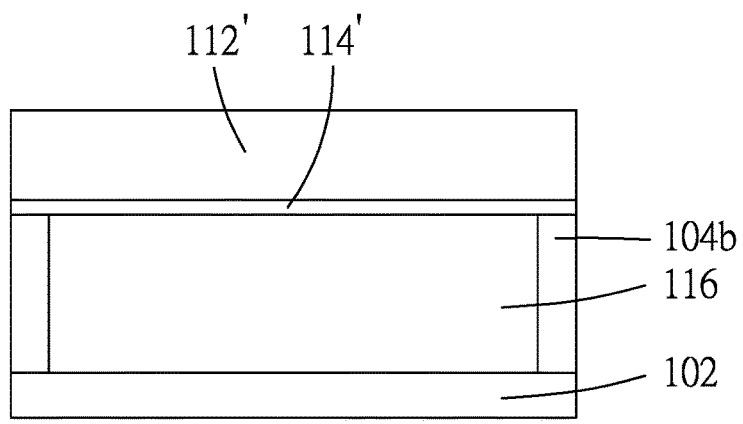

Referring to FIGS. 22 and 28, the method 2200 proceeds to step 2212, where a gate material layer 112' is formed on the gate dielectric material layer 114'. The materials and techniques used for forming the gate material layer 112' may be similar to those used for forming the gate material layer 112' as described in step 204, and the details thereof are omitted herein for the sake of brevity.

Figure 29:
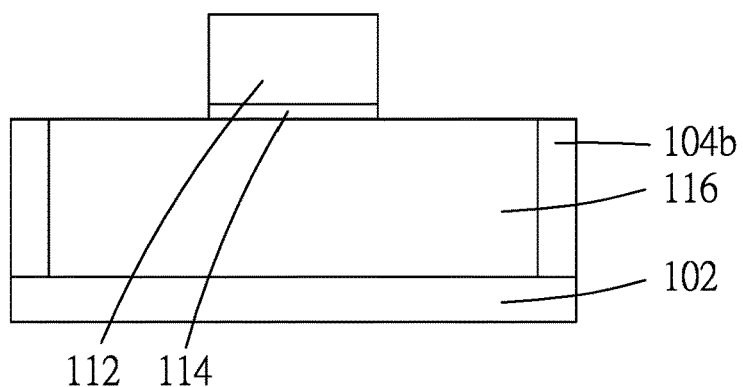

Referring to FIGS. 22 and 29, the method 2200 proceeds to step 2214, where a patterning process is conducted so as to form a pattern for the gate material layer 112' and the gate dielectric material layer 114'. As a result, a patterned gate material layer and a patterned gate dielectric material layer are formed to serve as the gate electrode 112 and the gate dielectric 114 (i.e., the gate stack) of the transistor 110 shown in FIG. 21, respectively. The patterning process may be similar to that as described in step 212, and the details thereof are omitted herein for the sake of brevity.

Figure 30:
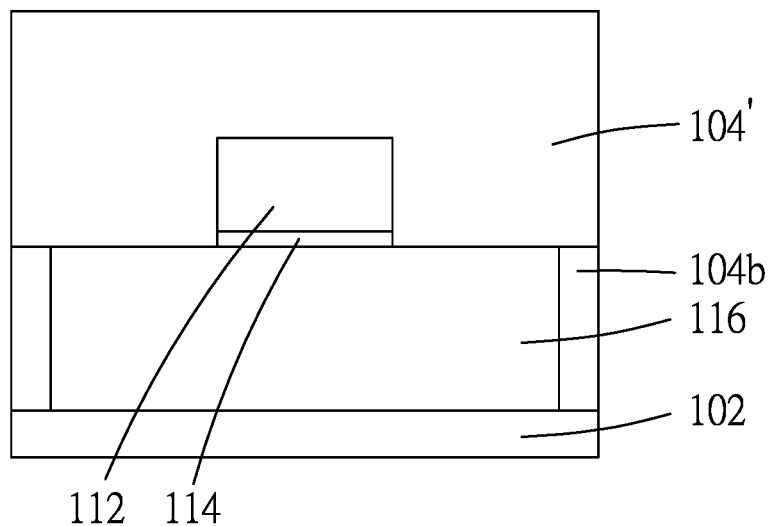

Afterward, referring to FIGS. 22 and 30, the method 2200 proceeds to step 2216, where a second dielectric material layer 104' is formed on the supplementary dielectric material layer 104b, the gate electrode 112, the gate dielectric 114, and the channel layer 116. The materials and techniques used for forming the second dielectric material layer 104' are similar to those used for forming the first dielectric layer 102 as described in step 202, and the details thereof are omitted herein for the sake of brevity. In some embodiments, the second dielectric material layer 104' may be a single material layer. In alternative embodiments, the second dielectric material layer 104' may be constituted by multiple films made of different materials which are suitable for forming the first dielectric layer 102. It is noted that a CMP process or other suitable process may be performed to planarize a top surface of the second dielectric material layer 104'.

Figure 31:
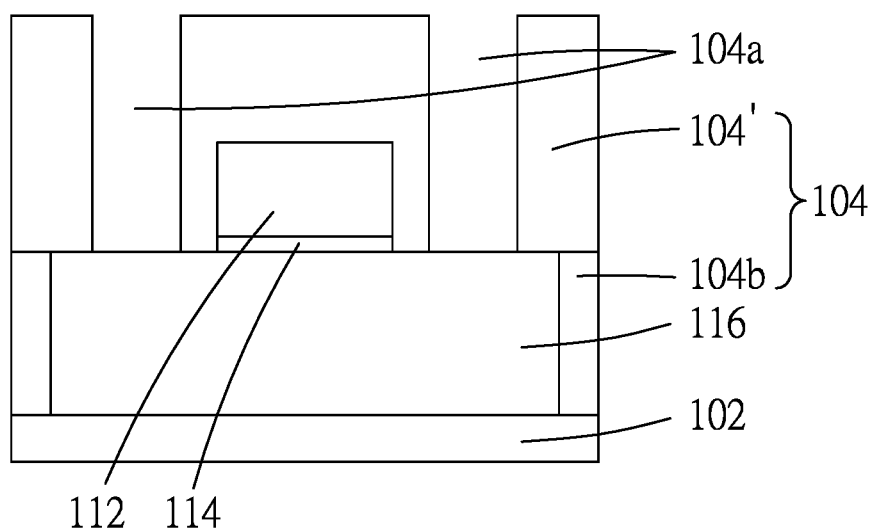

Referring to FIGS. 22 and 31, the method 2200 proceeds to step 2218, where a patterning process is conducted to pattern the second dielectric material layer 104'. The patterning process in this step may be implemented using a technique as described in step 212 such that portions of the second dielectric material layer 104' are removed in a top-down direction. As a result, two trenches 104a are formed in the second dielectric material layer 104', and the supplementary dielectric material layer 104b and the second dielectric material layer 104' together form the second dielectric layer 104 as shown in FIG. 21.

It is noted that the trenches 104a are formed for receiving the U-shaped buffer regions 1181 and the source/drain contacts 120, and a minimum distance between a respective one of the buffer regions 1181 to the gate stack 11 is to be maintained in order for the resulting transistor 110 to function normally. Based on different processes and design rules, the minimum distance may be in a range between about 2 nm to about 5 nm, although a slightly larger or smaller distance may be adopted. As such, the trenches 104a are formed such that the resulting buffer regions 1181 maintain the minimum distance.

Figure 32:
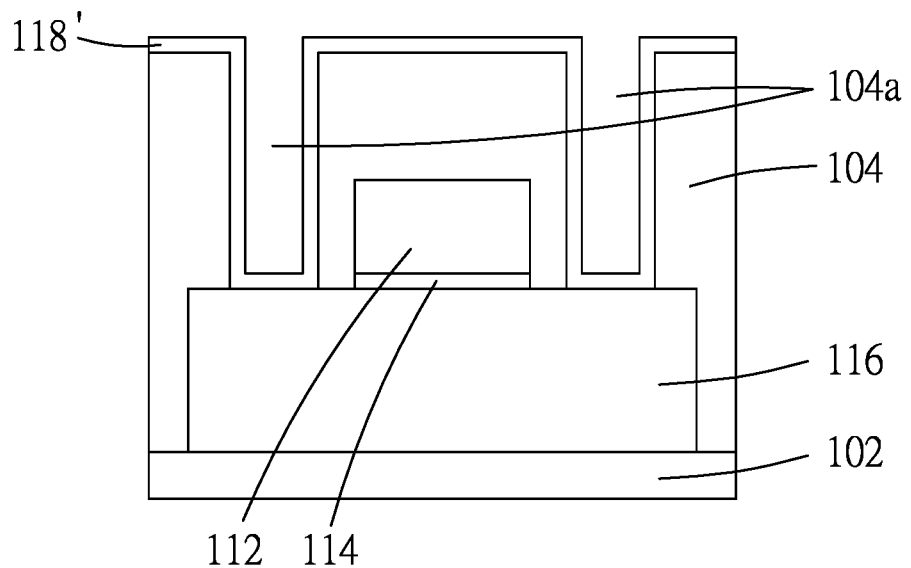

Referring to FIGS. 22 and 32, the method 2200 proceeds to step 2220, where a first buffer material layer 118' is conformally formed on the second dielectric layer 104 along inner surfaces of the trenches 104a. The materials and techniques used for forming the first buffer material layer 118' may be similar to those used for forming the first buffer material layer 118' as described in step 210, and the details thereof are omitted herein for the sake of brevity.

Figure 33:
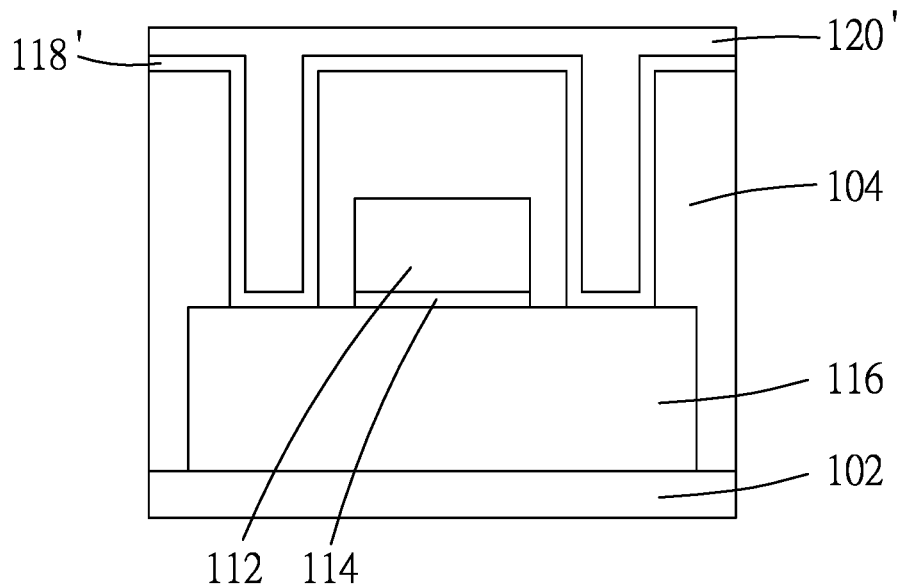

Referring to FIGS. 22 and 33, the method 2200 proceeds to step 2222, where a metal layer 120' is formed on the second dielectric layer 104 to fill the trenches 104a shown in FIG. 32, along the first buffer material layer 118'. The materials and techniques used for forming the metal layer 120' may be similar to those used for forming the metal layer 120' as described in step 218, and the details thereof are omitted herein for the sake of brevity.

Figure 34:
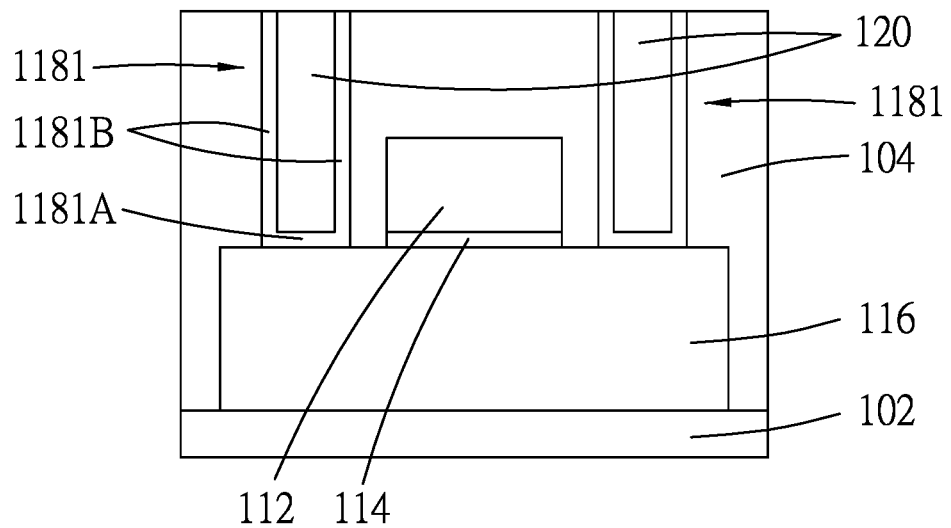

Referring to FIGS. 22 and 34, the method 2200 proceeds to step 2224, where a planarization process such as a CMP process, or other suitable technique is conducted to remove excesses of the first buffer material layer 118' and the metal layer 120' shown in FIG. 33. In some embodiments, the CMP process may be performed to the point that the second dielectric layer 104 is exposed. At this stage, the first buffer material layer 118' remaining in the trenches 104a shown in FIG. 33 may serve as the buffer regions 1181 of the transistor 110 shown in FIG. 21, and the metal layer 120' remaining in the trenches 104a shown in FIG. 33 may serve as the two source/drain contacts 120 of the transistor 110 shown in FIG. 21.

Thus, the method 2200 for manufacturing the semiconductor structure 100 shown in FIG. 21 is completed. In alternative embodiments, other suitable methods may also be applied for forming the semiconductor structure 100 shown in FIG. 21. In yet alternative embodiments, additional features may be added to the semiconductor structure 100 shown in FIG. 21, and some features of the semiconductor structure 100 shown in FIG. 21 may be modified, replaced, or eliminated without departing from the spirit and scope of the present disclosure.

It is noted that, according to some embodiments, the method 2200 may be implemented in an alternative manner.

Figure 35:
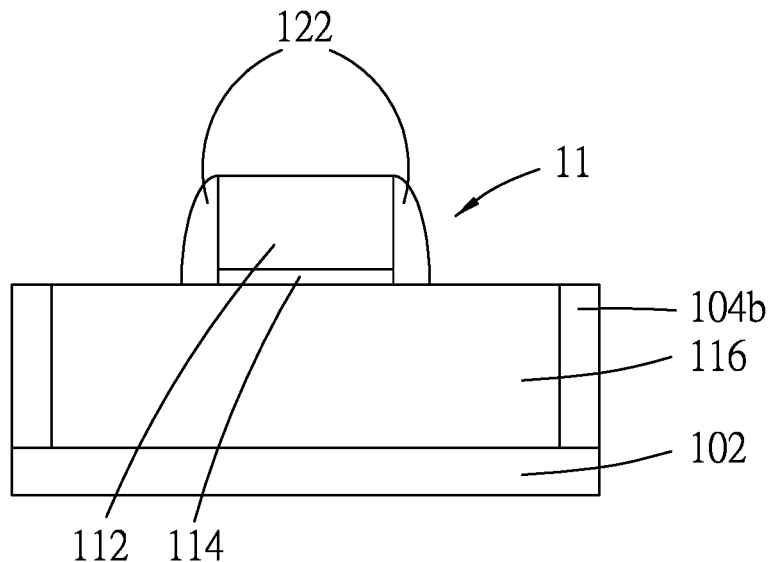
FIGS. 35 to 38 illustrate schematic views of intermediate stages of an alternative method for manufacturing the semiconductor structure in accordance with some embodiments.

For example, referring to FIGS. 22, 29 and 35, after step 2214, a structure as illustrated in FIG. 29 is obtained. Afterward, as shown in FIG. 35, two spacers 122 may be respectively formed at two opposite sides of the the gate electrode 112 and the gate dielectric 114 (i.e., the gate stack) so as to permit each of the spacers 122 to separate the gate stack from a respective one of the buffer regions 1181 (shown in FIG. 38) in the following step. The spacers 122 may be formed by depositing a dielectric layer (not shown) over the gate electrode 112, the gate dielectric 114 and the channel layer 116, and then etching the dielectric layer to obtain the spacers 122. The spacers 122 may include, for example, but not limited to, silicon oxide, silicon nitride, silicon oxynitride, high dielectric constant (k) materials, or combinations thereof. Other suitable materials for forming the spacers 122 are within the contemplated scope of the present disclosure. The etching of the not-shown dielectric layer may be implemented using a known process in the art, such as, but not limited to, a dry etching process, a wet etching process, other suitable processes, or combinations thereof. Although each of the spacers 122 shown in FIG. 35 has a rounded corner, the spacers 122 may be also formed to have an angled corner based on the selected etching process.

It is noted that in some embodiments, the gate electrode 112, the gate dielectric 114 and the spacers 122 may cooperatively form a gate structure 11.

Figure 36:
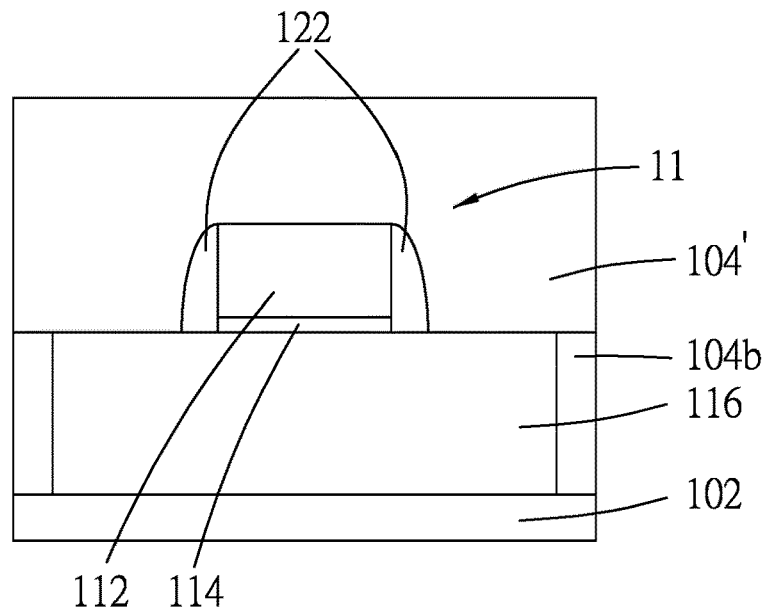

Afterward, referring to FIGS. 22 and 36, a second dielectric material layer 104' is formed on the supplementary dielectric material layer 104b, the gate structure 11, and the channel layer 116, in a manner similar to that described in step 2216. It is noted that a material used for forming the second dielectric material layer 104' is different from that used for forming the spacers 122.

Figure 37:
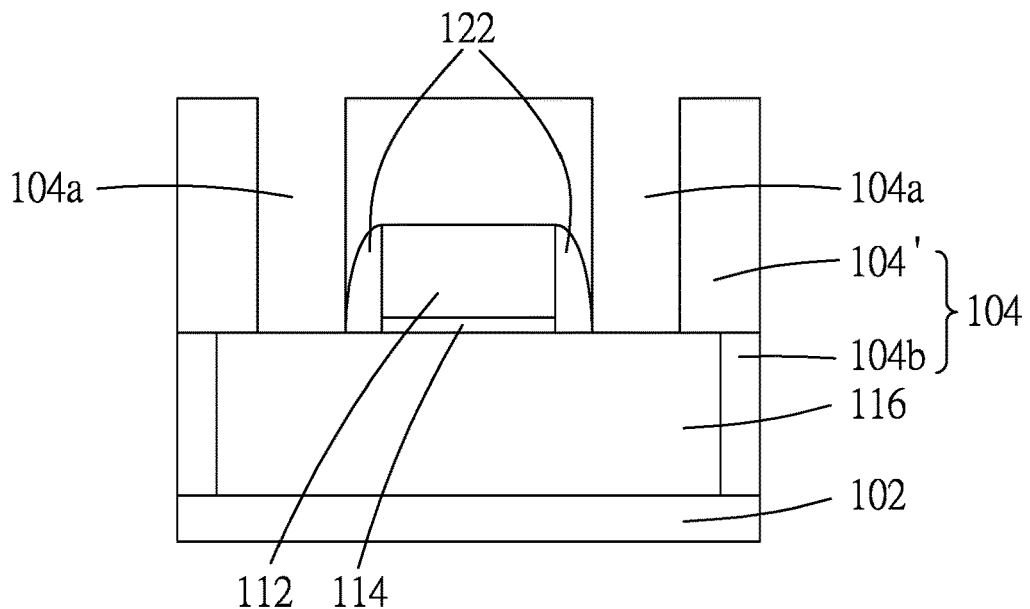

Afterward, referring to FIGS. 22 and 37, a patterning process is conducted to pattern the second dielectric material layer 104'. The patterning process in this step may be implemented using a technique as described in step 2218 such that portions of the second dielectric material layer 104' are removed in a top-down direction. As a result, two trenches 104a are formed in the second dielectric material layer 104', and the supplementary dielectric material layer 104b and the second dielectric material layer 104' together form a second dielectric layer 104. It is noted that because the material used for forming the second dielectric material layer 104' is different from that of the spacers 122, the trenches 104a may be formed by selectively etching the second dielectric material layer 104' to partially expose the spacers 122, respectively. In other words, the etchant has a higher etch selectivity to the second dielectric material layer 104' than to the spacers 122.

Figure 38:
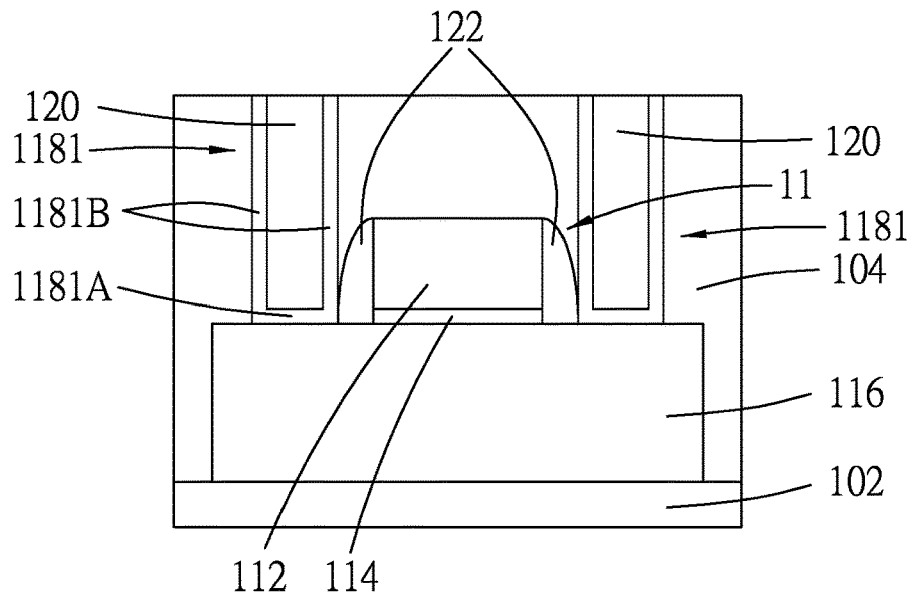

Afterward, referring to FIGS. 22 and 38, the buffer regions 1181 and the source/drain contacts 120 are respectively formed in the trenches 104a as shown in FIG. 37. The buffer regions 1181 and the source/drain contacts 120 may be formed in a manner similar to that of steps 2220 to 2224, and details thereof are omitted herein for the sake of brevity. It is noted that with the provision of the spacers 122, the gate stack (including the gate electrode 112 and the gate dielectric 114) is separated from the buffer regions 1181.

At this stage, the method for fabricating an alternative semiconductor structure 100 as shown in FIG. 38 is completed. It is noted that the semiconductor structure 100 as shown in FIG. 38 may possess the same advantages with those of the semiconductor structure 100 as shown in FIG. 21.

Figure 39:
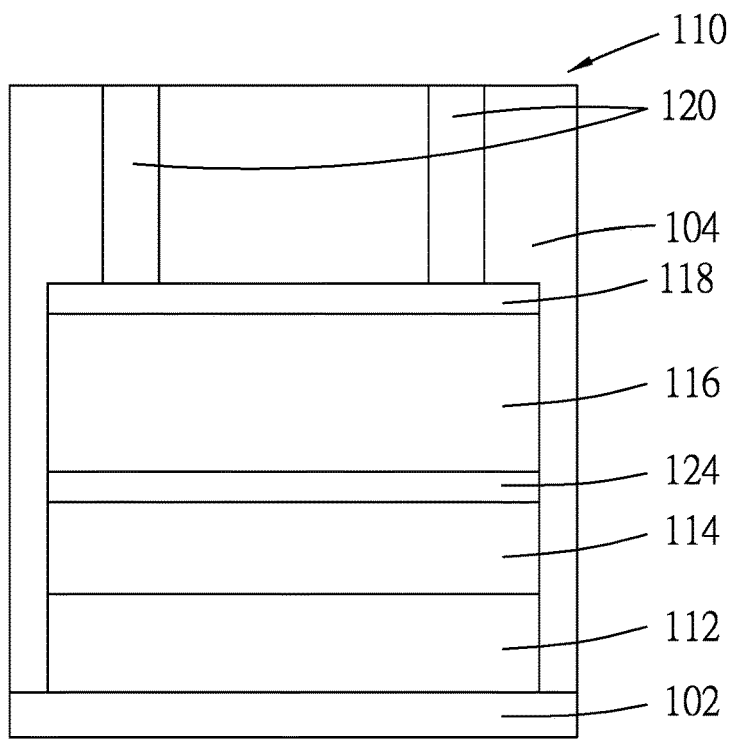
FIG. 39 illustrates a schematic cross-sectional view of a semiconductor structure in accordance with some embodiments.

FIG. 39 illustrates a schematic cross-sectional view of a semiconductor structure 100 in accordance with some embodiments. One difference between the semiconductor structure 100 as shown in FIG. 1 and the semiconductor structure 100 as shown in FIG. 39 is that the semiconductor structure 100 as shown in FIG. 39 further includes a second buffer layer 124 that is located between the gate dielectric 114 and the channel layer 116.

It is noted that, with the provision of the second buffer layer 124, the structure of the transistor 110 as shown in FIG. 39 may offer a number of advantages. For example, the hydrogen gas and/or free hydrogen atoms moving away from metallic materials located below the channel layer 116 (e.g., the gate electrode 112 or from other devices) may be received by the second buffer layer 124 instead of the channel layer 116, therefore may reduce the potential H-diffusion phenomenon and associated adverse effects.

Figure 40:
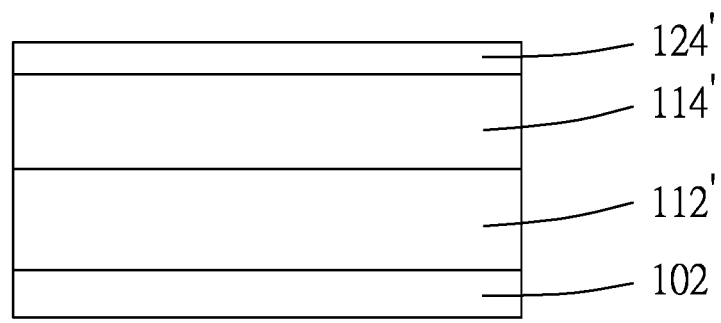
FIG. 40 illustrates a schematic view of an intermediate stage of a method for manufacturing the semiconductor structure as depicted in FIG. 39 in accordance with some embodiments.

It is noted that the semiconductor structure as shown in FIG. 39 may be fabricated using a method that is generally similar to the method 200. For example, referring to FIGS. 2 and 40, after step 206, a step of forming a second buffer material layer 124' on the gate dielectric material layer 114' shown in FIG. 5 may be implemented in a manner similar to that of step 210. Afterward, the method 200 proceeds to step 208 for forming the channel material layer 116' shown in FIG. 6 on the second buffer material layer 124' shown in FIG. 40, and then to step 210 for forming the a first buffer material layer 118' shown in FIG. 7, followed by to step 212 for conducting the patterning process. In this case, the patterning process forms a pattern for the gate material layer 112', the gate dielectric material layer 114', the second buffer material layer 124', the channel material layer 116' and the first buffer material layer 118' (see also FIG. 7). As a result, a patterned gate material layer, a patterned gate dielectric material layer, a patterned second buffer layer, a patterned channel material layer and a patterned first buffer material layer are formed to serve as the gate electrode 112, the gate dielectric 114, the second buffer layer 124, the channel layer 116, and the first buffer layer 118 of the transistor 110 as shown in FIG. 39, respectively. Afterward, the remaining steps of the method 200 may be implemented to obtain the structure of the transistor 110 as shown in FIG. 39.

Figure 41:
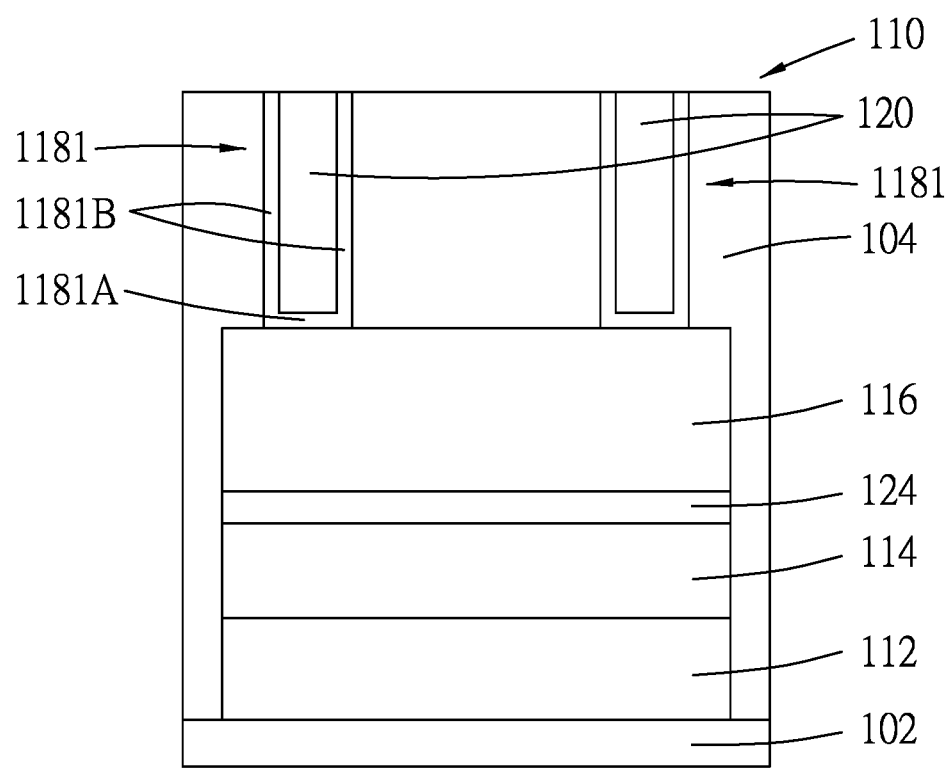
FIG. 41 illustrates a schematic cross-sectional view of a semiconductor structure in accordance with some embodiments.

FIG. 41 illustrates a schematic cross-sectional view of a semiconductor structure 100 in accordance with some embodiments. One difference between the semiconductor structure 100 as shown in FIG. 14 and the semiconductor structure 100 as shown in FIG. 41 is that the semiconductor structure 100 as shown in FIG. 41 further includes a buffer layer 124 that is located between the gate dielectric 114 and the channel layer 116.

It is noted that, with the provision of the buffer layer 124, the structure of the transistor 110 as shown in FIG. 41 may offer a number of advantages that are similar to those of the transistors 110 as shown in FIGS. 14 and 39. For example, the hydrogen gas and/or free hydrogen atoms diffusing away from metallic materials located below the channel layer 116 (e.g., the gate electrode 112 or from other devices) may be received by the buffer layer 124 instead of the channel layer 116, therefore may reduce the potential H-diffusion phenomenon and associated adverse effects.

It is noted that the semiconductor structure 100 as shown in FIG. 41 may be fabricated using a method that is generally similar to the method 1500. For example, referring to FIGS. 22 and 40, after step 1506, a step of forming the buffer material layer 124' on the gate dielectric material layer 114' may be implemented in a manner similar to that of step 210. Afterward, the method 1500 proceeds to step 1508 for forming the channel material layer 116' shown in FIG. 6 on the buffer material layer 124', and then to step 1510 for conducting the patterning process. In this case, the patterning process forms a pattern for the gate material layer 112', the gate dielectric material layer 114', the buffer material layer 124', and the channel material layer 116' (see also FIG. 6). As a result, a patterned gate material layer, a patterned gate dielectric material layer, a patterned second buffer layer, and a patterned channel material layer are formed to serve as the gate electrode 112, the gate dielectric 114, the buffer layer 124, and the channel layer 116 of the transistor 110 shown in FIG. 41, respectively. Afterward, the remaining steps of method 1500 may be implemented to obtain the structure of the transistor 110 as shown in FIG. 41.

Figure 42:
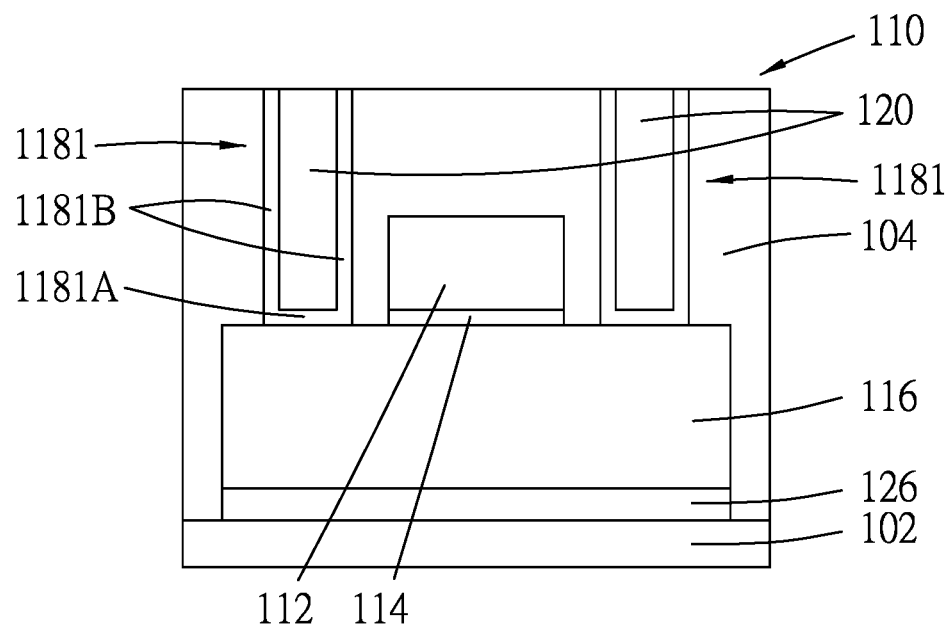
FIG. 42 illustrates a schematic cross-sectional view of a semiconductor structure in accordance with some embodiments.

FIG. 42 illustrates a schematic cross-sectional view of a semiconductor structure 100 including a transistor 110 in accordance with some embodiments. One difference between the semiconductor structure 100 as shown in FIG. 21 and the semiconductor structure 100 as shown in FIG. 42 is that the semiconductor structure 100 as shown in FIG. 42 further includes a buffer layer 126 that is located between the channel layer 116 and the first dielectric layer 102. That is to say, the buffer layer 126 is disposed below the channel layer 116 opposite to the gate stack (including the gate electrode 112 and the gate dielectric 114).

It is noted that, with the provision of the buffer layer 126, the structure of the transistor 110 as shown in FIG. 42 may offer a number of advantages that are similar to those of the transistors 110 as as shown in FIGS. 21 and 39.

Figure 43:
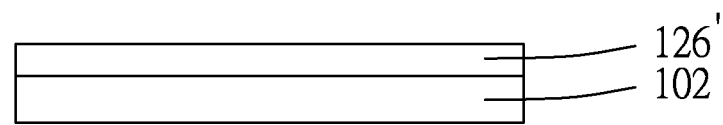
FIG. 43 illustrates a schematic view of an intermediate stage of a method for manufacturing the semiconductor structure as depicted in FIG. 42 in accordance with some embodiments.

It is noted that the semiconductor structure as shown in FIG. 42 may be fabricated using a method that is generally similar to the method 2200. For example, referring to FIGS. 22 and 43, after step 2202, a step of forming a buffer material layer 126' on the first dielectric layer 102 may be implemented in a manner similar to that of step 210. Afterward, the method 2200 proceeds to step 2204 for forming the channel material layer 116' shown in FIG. 6 on the buffer material layer 126', and then to step 2206 for conducting the patterning process. In this case, the patterning process forms a pattern for the buffer material layer 126' and the channel material layer 116'. As a result, a patterned buffer layer and a patterned channel material layer are formed to serve as the buffer layer 126, and the channel layer 116 of the transistor 110 shown in FIG. 42, respectively. Afterward, the remaining steps of method 2200 may be implemented to obtain the structure of the transistor 110 as shown in FIG. 42.

In this disclosure, a structure of a transistor is provided, where a barrier region is provided around each of the source/drain contacts. In this structure, hydrogen gas and/or free hydrogen atoms (which may be introduced or generated in various processes, such as deposition processes including CVD, annealing, etc.) from the source/drain contacts or other devices may be prevented from diffusing into the channel layer. As such, the channel layer may be less likely to be doped by the hydrogen gas and/or free hydrogen atoms, and an adverse effect to a threshold voltage of the transistor may be reduced. In addition, because the hydrogen gas and/or the free hydrogen atoms may be absorbed by the barrier regions and/or the barrier layer, a Schottky barrier may be improved and a contact resistance between the source/drain contacts and the channel layer may be reduced. This in turn improves the robustness of the channel layer of the transistor. This structure may be useful in fabricating scaled thin-film transistors (TFT) in a BEOL process.

In accordance with some embodiments of the present disclosure, a transistor includes a gate electrode, a gate dielectric located over the gate electrode, a channel layer that includes an oxide semiconductor material and that is located over the gate dielectric, a buffer located to cover at least a portion of the channel layer, and source/drain contacts disposed on the buffer. The buffer includes a material that receives hydrogen.

In accordance with some embodiments of the present disclosure, a transistor includes a channel layer including an oxide semiconductor material, a gate structure including a gate dielectric located over the channel layer, and a gate electrode located over the gate dielectric, source/drain contacts that are located over the channel layer, and that are disposed at opposite sides of the gate structure, and buffer regions surrounding the source/drain contacts, respectively. The buffer regions include a material that receives hydrogen.

In accordance with some embodiments of the present disclosure, a method for manufacturing a transistor, includes forming a channel layer that includes an oxide semiconductor material, forming a buffer on the channel layer, forming source/drain contacts on the buffer, and forming a gate stack including gate electrode and a gate dielectric such that the gate dielectric is disposed between the gate electrode and the channel layer. The buffer includes a material that receives hydrogen.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a gate electrode;
   a gate dielectric;
   a channel layer including an oxide semiconductor material, and disposed to permit the gate dielectric to be located between the gate electrode and the channel layer;

a buffer located to cover at least a portion of the channel layer, the buffer includes a material that receives hydrogen; and source/drain contacts disposed on the buffer;

wherein the buffer includes a metal compound including zinc and nickel.

2. The transistor of claim 1, wherein the channel layer has an upper surface confronting the gate dielectric, a lower surface opposite to the upper surface, and two lateral surfaces each interconnecting the upper and lower surfaces, the transistor further comprising:

a first dielectric layer connected to the lower surface of the channel layer; and a second dielectric layer extending upwardly from the first dielectric layer to cover the two lateral surfaces of the channel layer.

3. The transistor of claim 1, wherein the buffer include two buffer regions surrounding the source/drain contacts, respectively, and each of the buffer regions has an interconnecting section that is located between the channel layer and a respective one of the two source/drain contacts, and two extending sections that respectively extend from two ends of the interconnecting section to be in contact with the respective one of the source/drain contacts.

4. The transistor of claim 3, wherein the buffer regions are spaced apart from each other.

5. The transistor of claim 1, wherein the oxide semiconductor material includes indium gallium zinc oxide, tungsten-doped indium oxide, indium zinc oxide, indium tin oxide, gallium oxide, indium oxide, or combinations thereof.

6. The transistor of claim 1, wherein the buffer includes a first buffer layer which is disposed to separate the source/drain contacts from the channel layer.

7. The transistor of claim 6, wherein the buffer further includes a second buffer layer disposed between the gate dielectric and the channel layer.

8. A transistor comprising:

a channel layer including an oxide semiconductor material;

a gate structure including a gate dielectric located over the channel layer, and a gate electrode located over the gate dielectric;

source/drain contacts located over the channel layer, and disposed at opposite sides of the gate structure; and buffer regions surrounding the source/drain contacts, respectively, the buffer regions including a material that receives hydrogen, wherein the buffer regions include a metal compound including zinc and nickel.

9. The transistor of claim 8, wherein the channel layer has an upper surface confronting the gate dielectric, a lower surface opposite to the upper surface, and two lateral surfaces each interconnecting the upper and lower surfaces, the transistor further comprising:

a first dielectric layer connected to the lower surface of the channel layer; and a second dielectric layer extending upwardly from the first dielectric layer to cover the two lateral surfaces of the channel layer.

10. The transistor of claim 8, wherein the oxide semiconductor material includes indium gallium zinc oxide, tungsten-doped indium oxide, indium zinc oxide, indium tin oxide, gallium oxide, indium oxide, or combinations thereof.

11. The transistor of claim 8, wherein the gate structure further includes two spacers which are respectively located at two opposite sides of a gate stack that includes the gate dielectric and the gate electrode, and which are made of a dielectric material so as to permit each of the spacers to separate the gate stack from a respective one of the buffer regions.

12. The transistor of claim 8, further comprising a buffer layer disposed below the channel layer opposite to the gate structure.

13. A method for manufacturing a transistor, comprising:

forming a channel layer that includes an oxide semiconductor material;

forming a buffer on the channel layer, the buffer including a material that receives hydrogen, wherein the buffer includes a metal compound including zinc and nickel;

forming source/drain contacts on the buffer; and forming a gate stack including gate electrode and a gate dielectric such that the gate dielectric is disposed between the gate electrode and the channel layer.

14. The method of claim 13, wherein the channel layer has an upper surface confronting the gate stack, a lower surface opposite to the upper surface, and two lateral surfaces each interconnecting the upper and lower surfaces, the method further comprising:

forming a lower dielectric layer that is connected to the lower surface of the channel layer; and forming an upper dielectric layer that extends upwardly from the lower dielectric layer to cover the two lateral surfaces of the channel layer.

15. The method of claim 13, wherein the buffer includes a first buffer layer that is disposed to separate the source/drain contacts from the channel layer.

16. The method of claim 13, further comprising forming a second buffer layer disposed below the channel layer opposite to the source/drain contacts.

17. The method of claim 13, wherein the gate electrode and the gate dielectric are formed before formation of the channel layer.

18. The method of claim 13, wherein the source/drain contacts and the buffer are formed by, after forming the channel layer:

forming an upper dielectric layer on the channel layer;

forming trenches in the upper dielectric layer to expose the channel layer;

forming buffer regions respectively in the trenches, the buffer regions serving as the buffer; and forming the source/drain contacts respectively in the trenches so as to permit each of the source/drain contacts to be surrounded by a respective one of the buffer regions.

19. The method of claim 18, wherein the gate stack is formed between the source/drain contacts, the method further comprising, prior to forming the source/drain contacts and the buffer, forming two spacers at two opposite sides of the gate stack so as to permit each of the spacers to separate the gate stack from a respective one of the buffer regions.

20. The method of claim 19, wherein the spacers include a dielectric material different from a material of the upper dielectric layer, and wherein the trenches are formed by selectively etching the upper dielectric layer to partially expose the spacers, respectively.

* * * * *